(12) United States Patent
Toh et al.

(10) Patent No.: US 9,871,032 B2
(45) Date of Patent: Jan. 16, 2018

(54) GATE-GROUNDED METAL OXIDE SEMICONDUCTOR DEVICE

(71) Applicant: GLOBALFOUNDRIES Singapore Pte. Ltd., Singapore (SG)

(72) Inventors: Eng Huat Toh, Singapore (SG); Kiok Boone Elgin Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/848,364

(22) Filed: Sep. 9, 2015

(65) Prior Publication Data
US 2017/0069619 A1   Mar. 9, 2017

(51) Int. Cl.
*H01L 27/02* (2006.01)
*H01L 29/78* (2006.01)
*H01L 29/66* (2006.01)

(52) U.S. Cl.
CPC .... *H01L 27/0266* (2013.01); *H01L 29/66492* (2013.01); *H01L 29/7833* (2013.01)

(58) Field of Classification Search
CPC ........... H01L 29/66492; H01L 29/7833
See application file for complete search history.

(56) References Cited

U.S. PATENT DOCUMENTS

| 8,815,672 | B2 | 8/2014 | Lee et al. | |
|---|---|---|---|---|
| 2002/0135029 | A1* | 9/2002 | Ping | H01L 21/02381 257/401 |
| 2003/0230780 | A1* | 12/2003 | Cai | H01L 27/0266 257/355 |
| 2005/0045954 | A1* | 3/2005 | Kao | H01L 21/26513 257/355 |
| 2008/0224220 | A1* | 9/2008 | Blanc | H01L 27/0266 257/357 |
| 2010/0032749 | A1* | 2/2010 | Shrivastava | H01L 21/26586 257/328 |
| 2010/0140713 | A1* | 6/2010 | Imoto | H01L 27/0277 257/355 |
| 2012/0223372 | A1* | 9/2012 | Alptekin | H01L 21/28518 257/288 |
| 2013/0217190 | A1* | 8/2013 | Jagannathan | H01L 29/4908 438/151 |
| 2014/0287564 | A1* | 9/2014 | Park | H01L 29/0847 438/285 |

(Continued)

OTHER PUBLICATIONS

Jae-Hyun Yoo et al., P-type Isolated GGNMOS with a Deep Current Path for ESD Protection. Proceedings of the 23rd International Symposium on Power Semiconductor Devices & IC's May 23-26, 2011 San Diego, CA.*

(Continued)

*Primary Examiner* — Benjamin Sandvik
*Assistant Examiner* — Farid Khan
(74) *Attorney, Agent, or Firm* — Horizon IP Pte Ltd.

(57) ABSTRACT

A gate-grounded metal oxide semiconductor (GGMOS) device is disclosed. The GGMOS is an n-type (GGNMOS) transistor used as an electrostatic discharge (ESD) protection device. The GGMOS includes a base extension region under an elevated source. The elevated source and base extension regions increase $L_{eff}$ and reduce beta, increasing performance of the ESD protection.

20 Claims, 38 Drawing Sheets

(56) References Cited

U.S. PATENT DOCUMENTS

| | | | |
|---|---|---|---|
| 2015/0061010 A1* | 3/2015 | Cheng ................ | H01L 29/0692 257/344 |
| 2015/0129977 A1* | 5/2015 | Chen .................. | H01L 27/0277 257/390 |
| 2015/0194501 A1* | 7/2015 | Yin ................... | H01L 29/66545 438/300 |
| 2015/0333068 A1* | 11/2015 | Toh .................... | H01L 27/1027 257/107 |

OTHER PUBLICATIONS

Jae-Hyun Yoo et al., P-type Isolated GGNMOS with a Deep Current Path for ESD Protection, Proceedings of the 23rd International Symposium on Power Semiconductor Devices & IC's, May 23-26, 2011, San Diego, CA.

\* cited by examiner

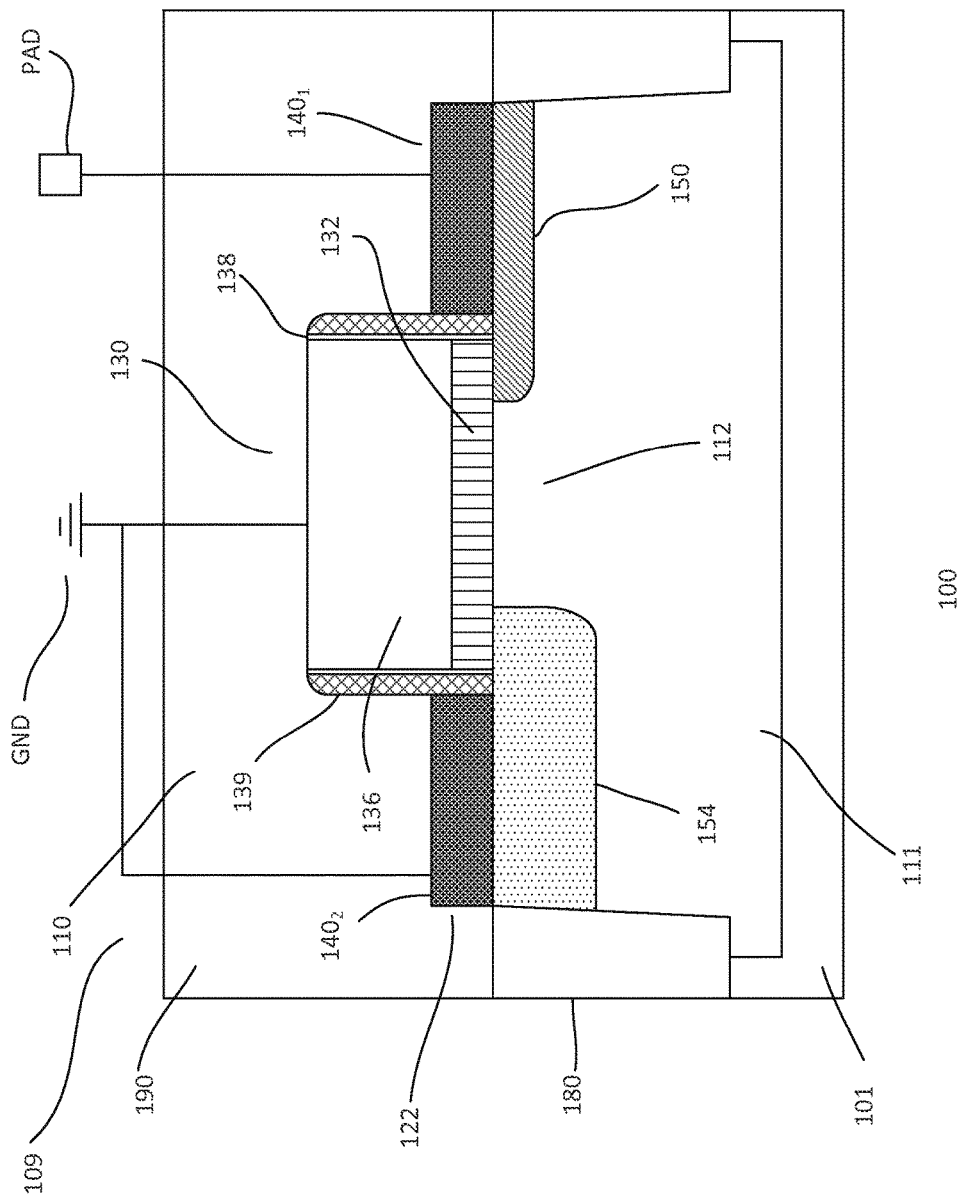

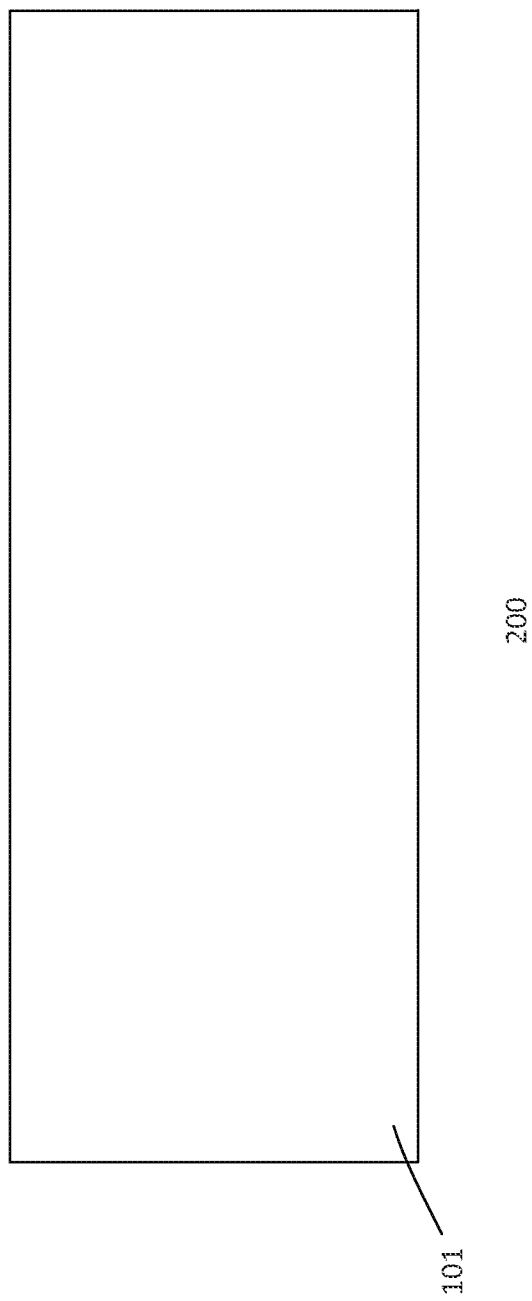

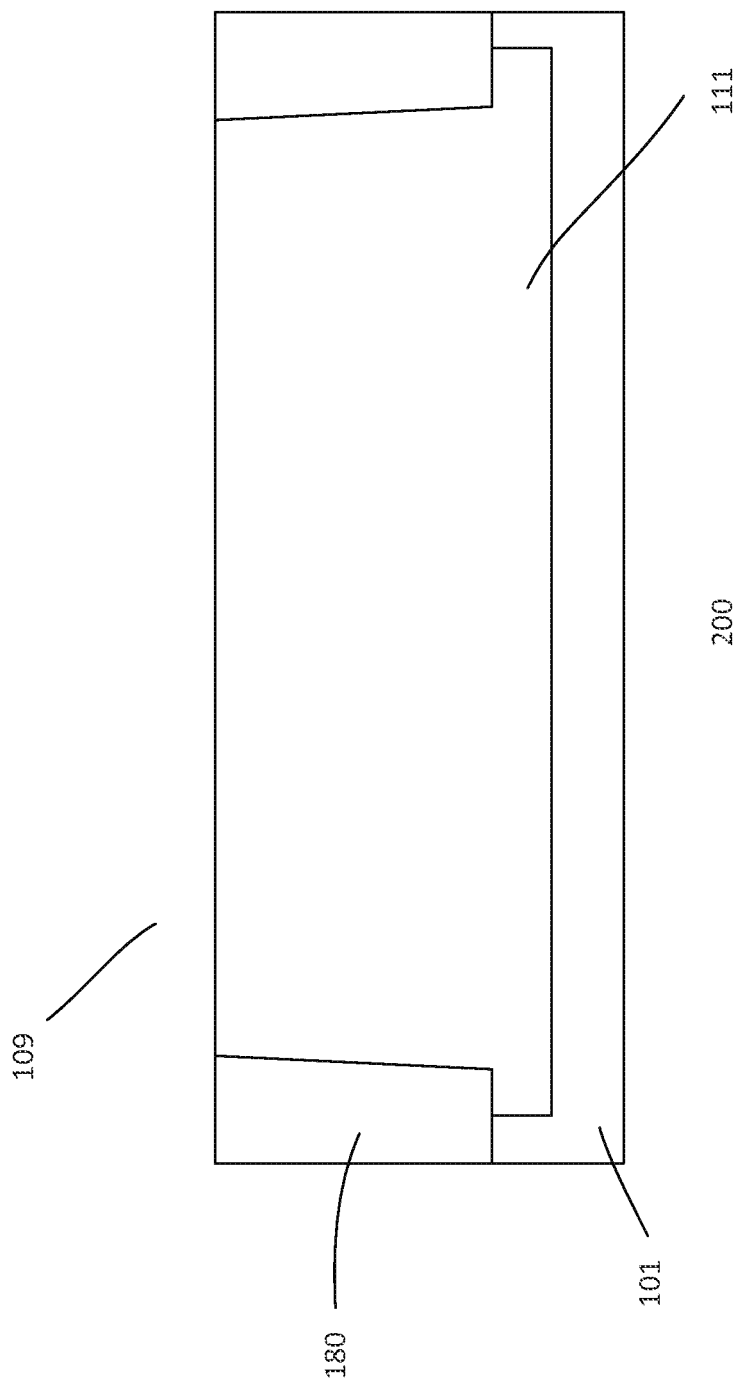

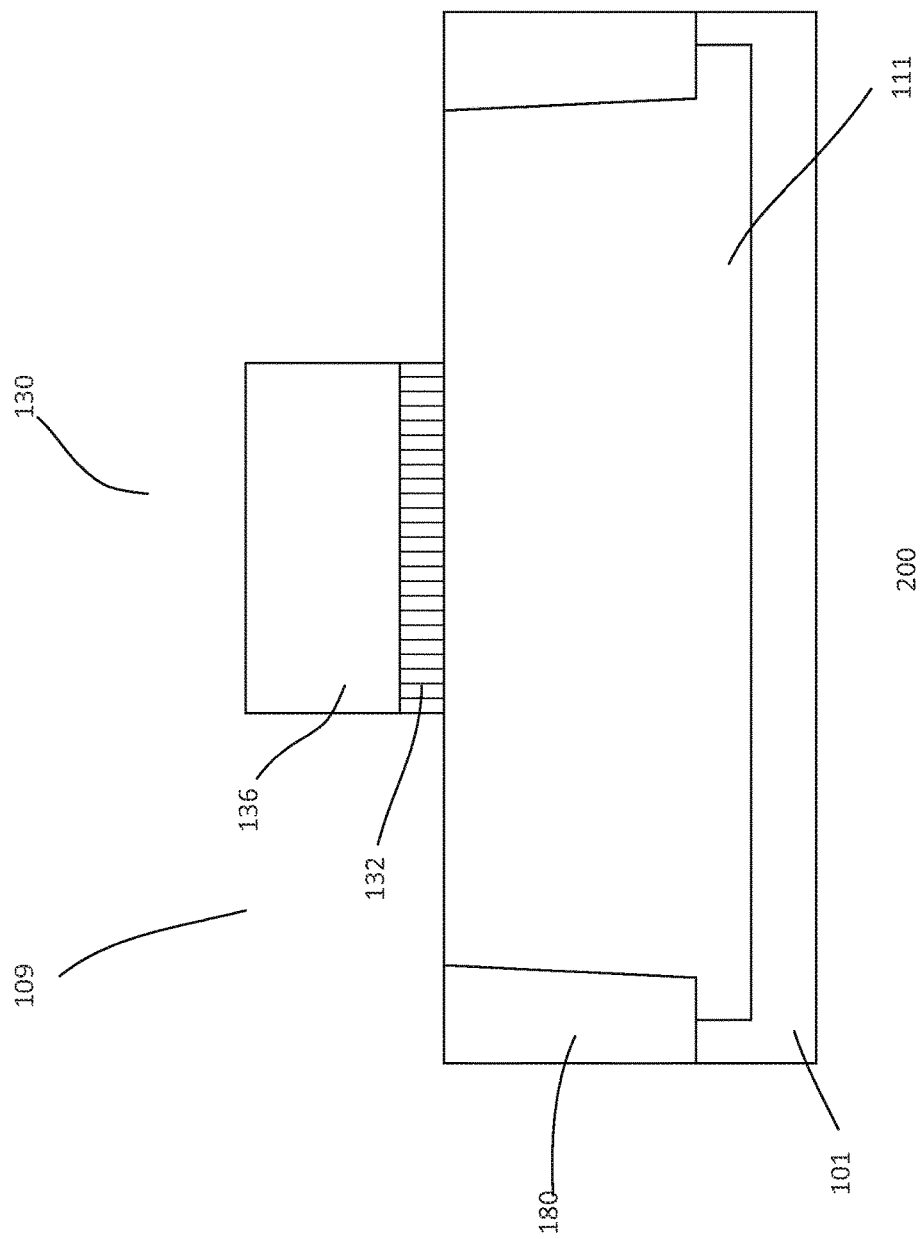

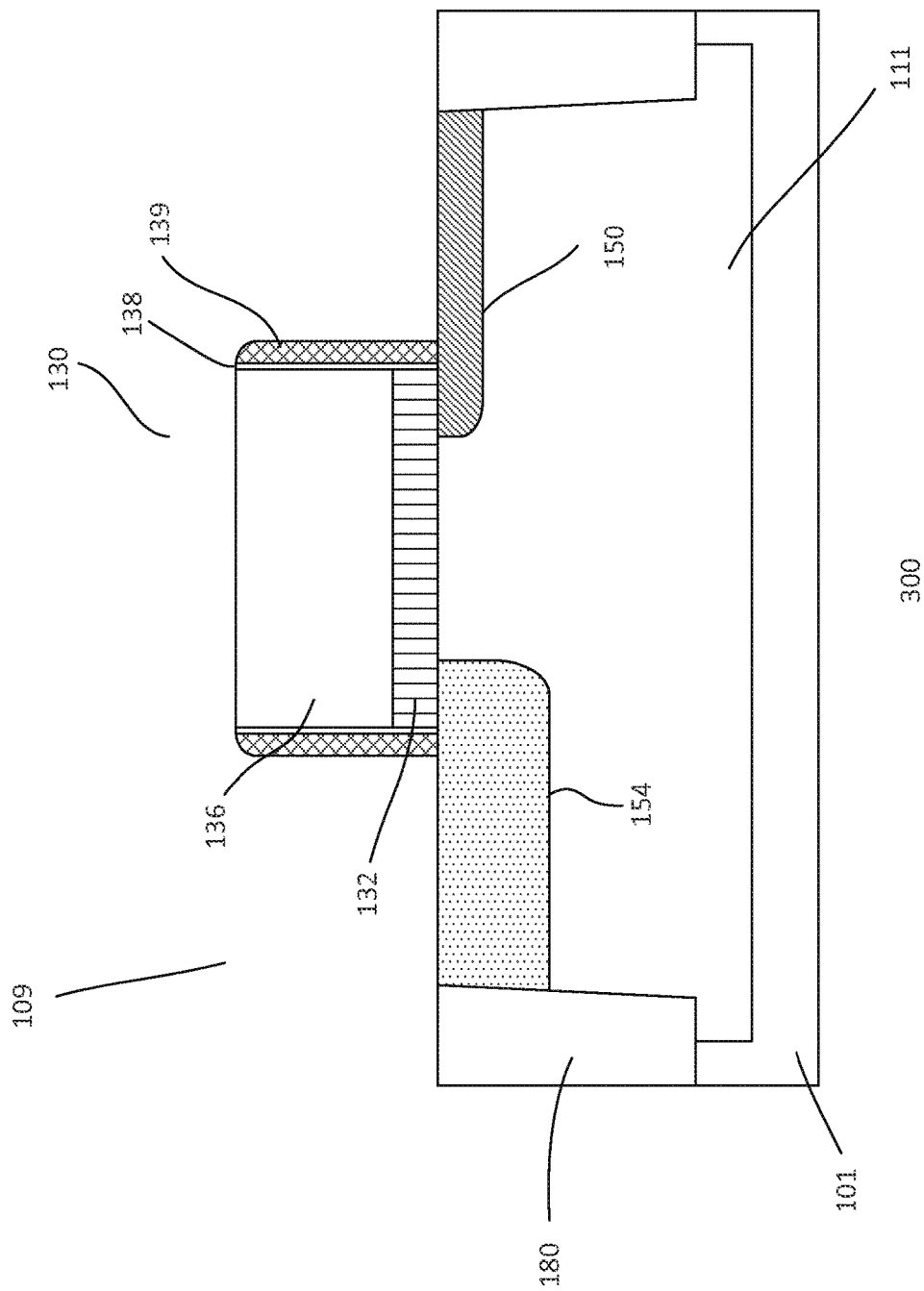

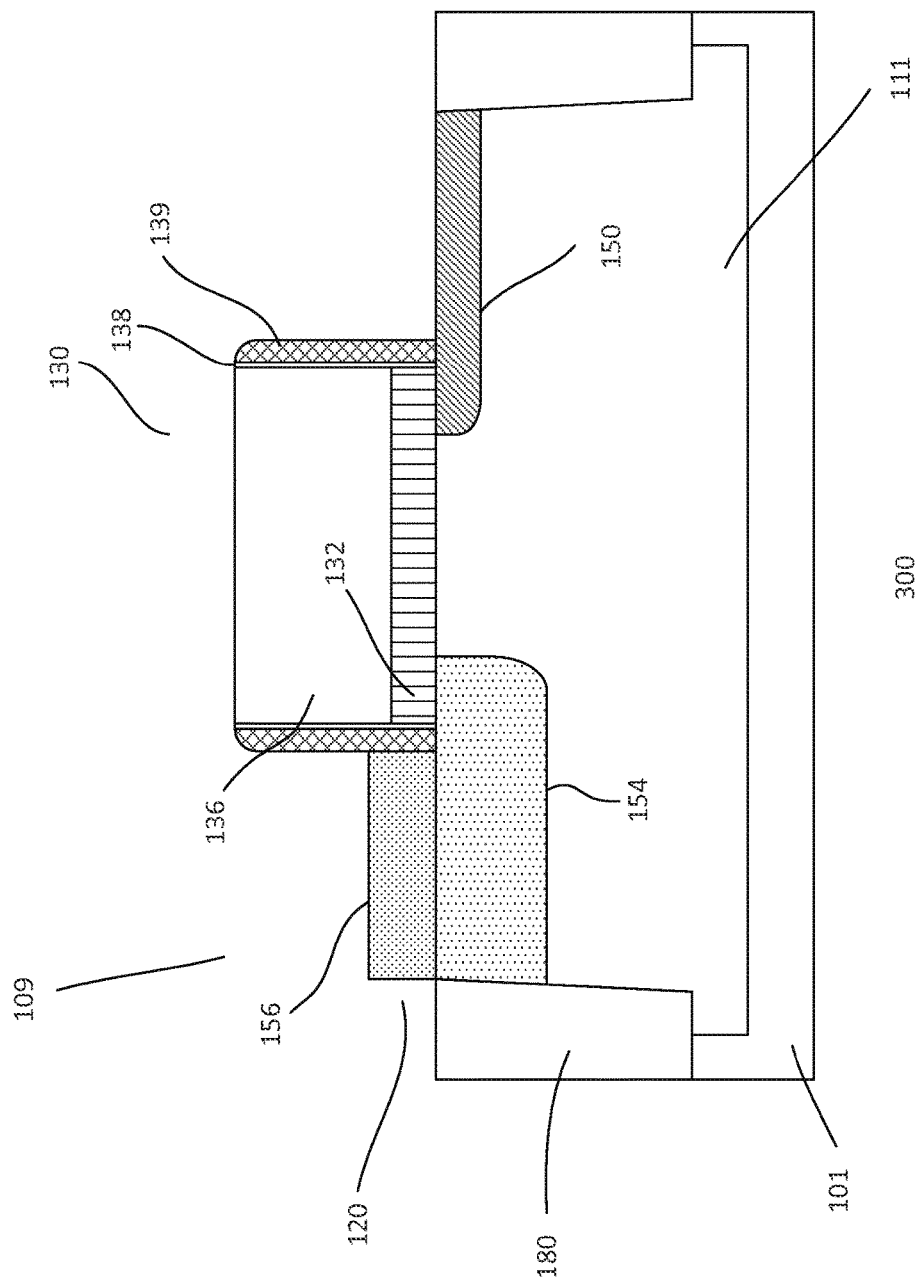

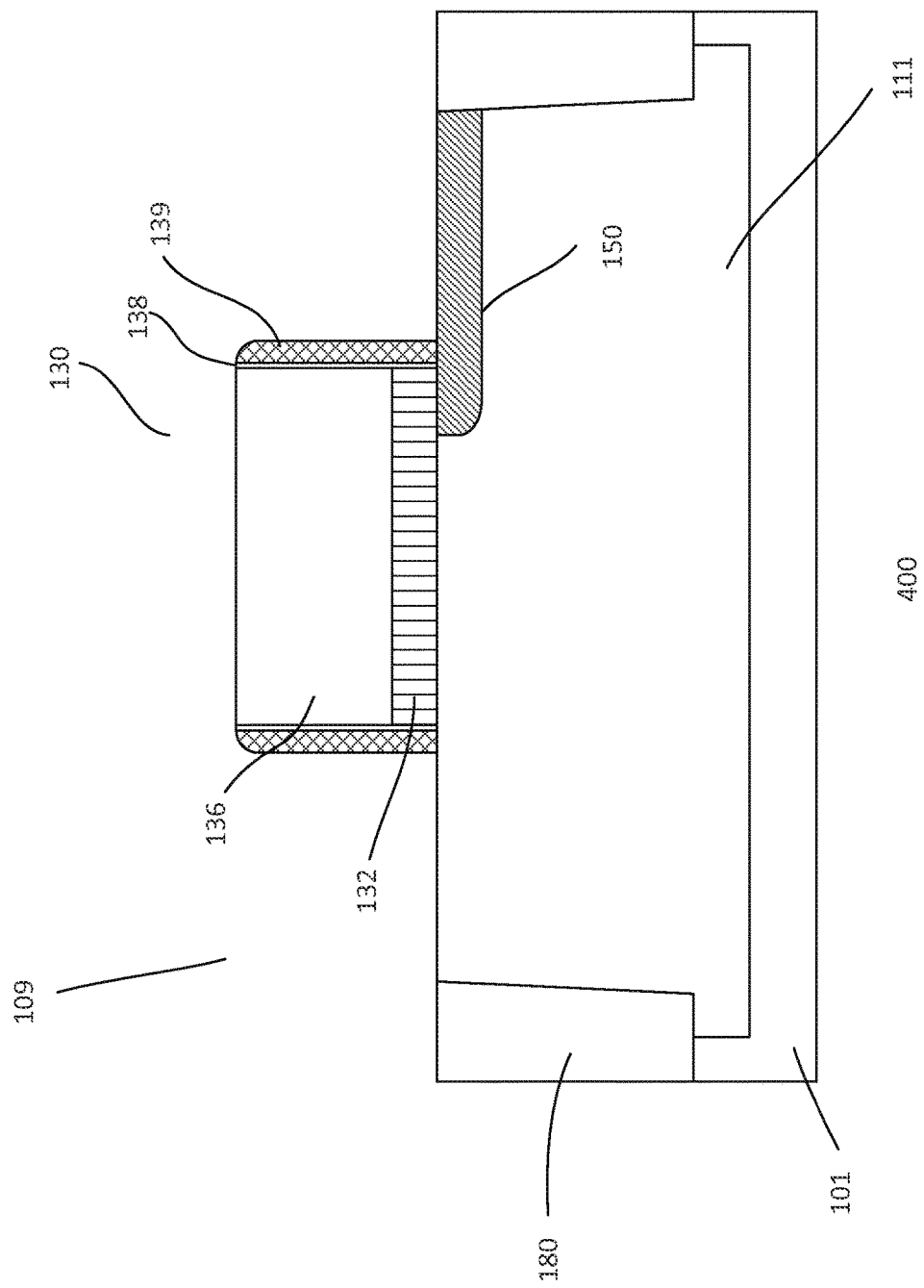

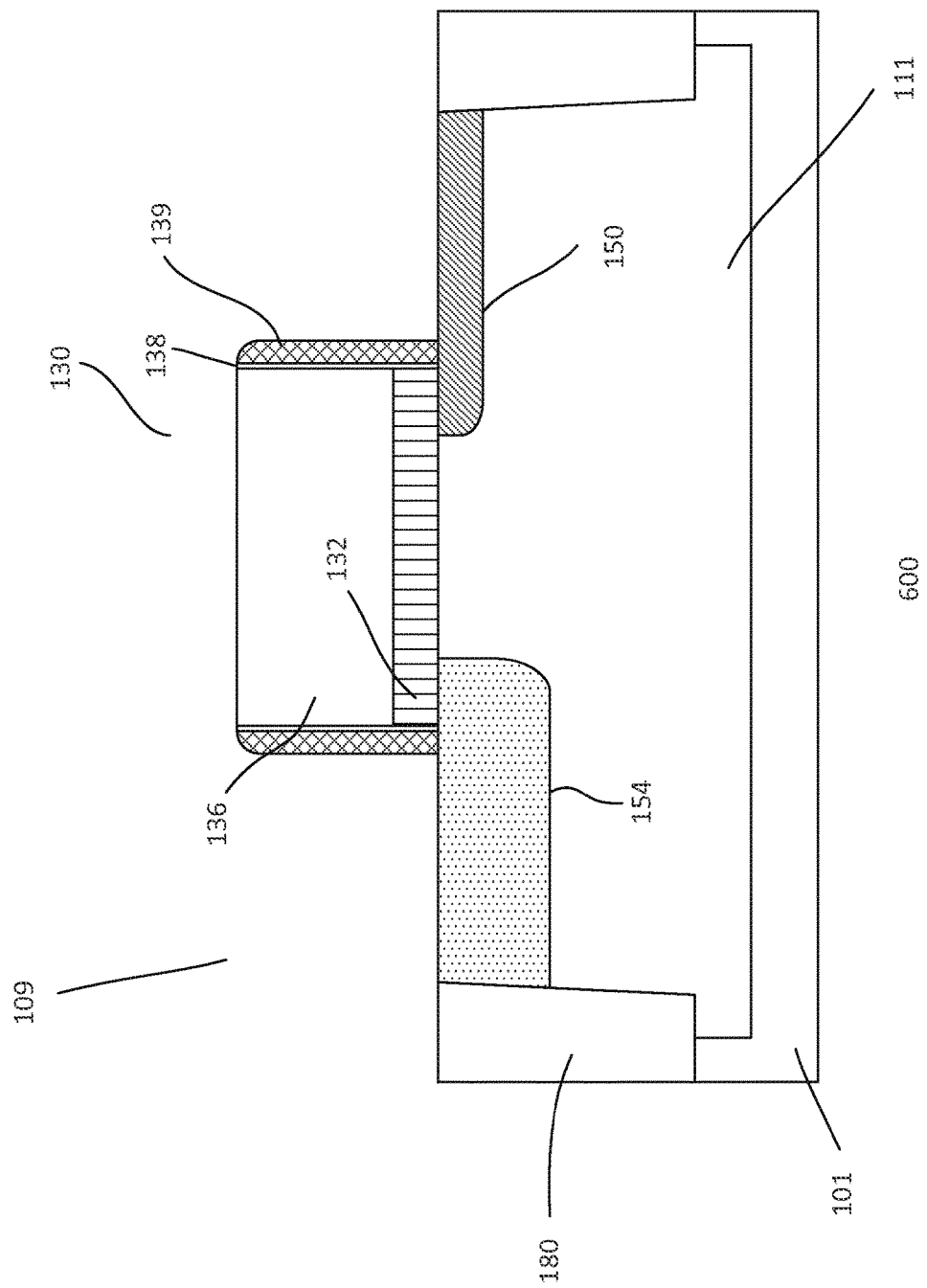

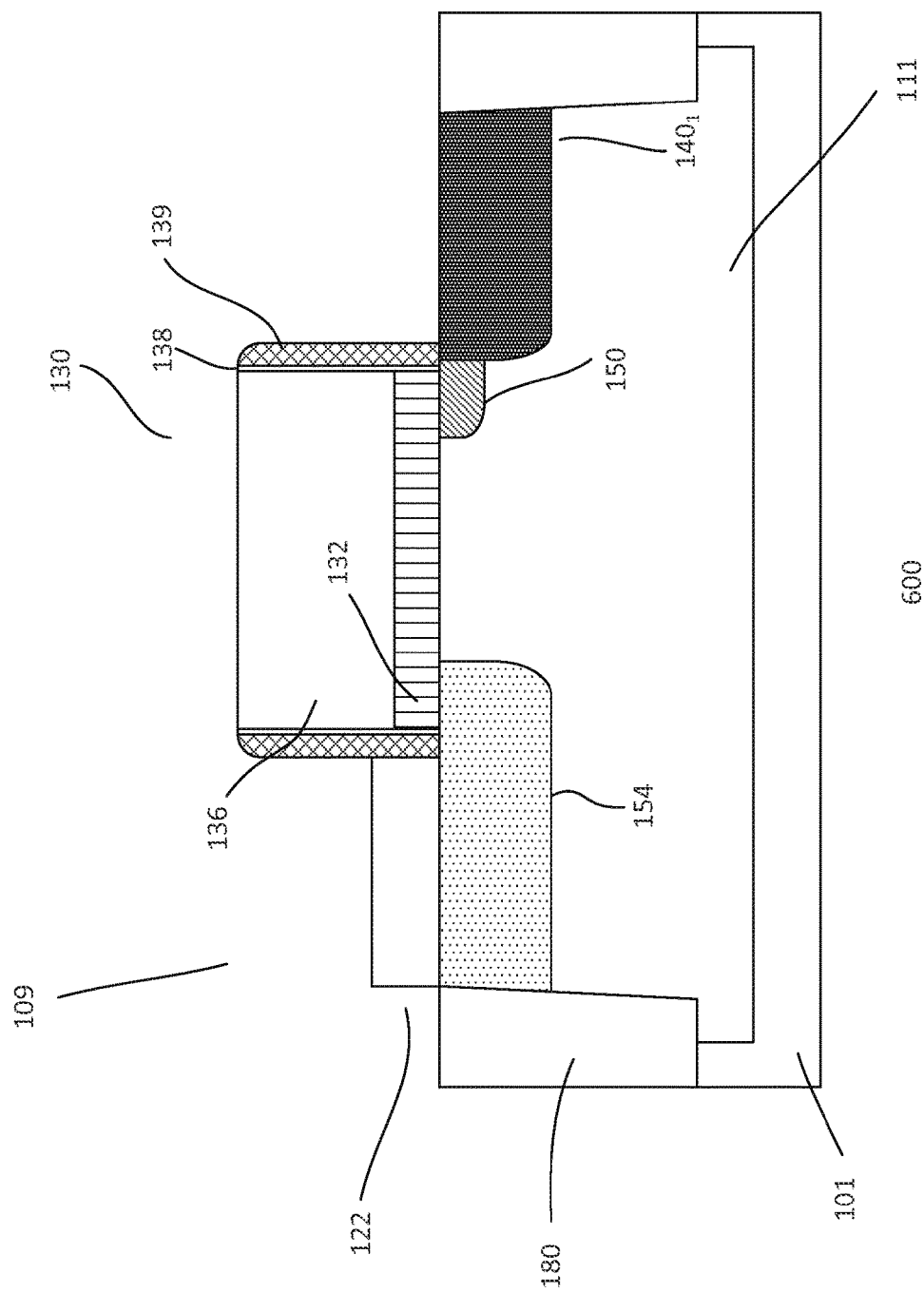

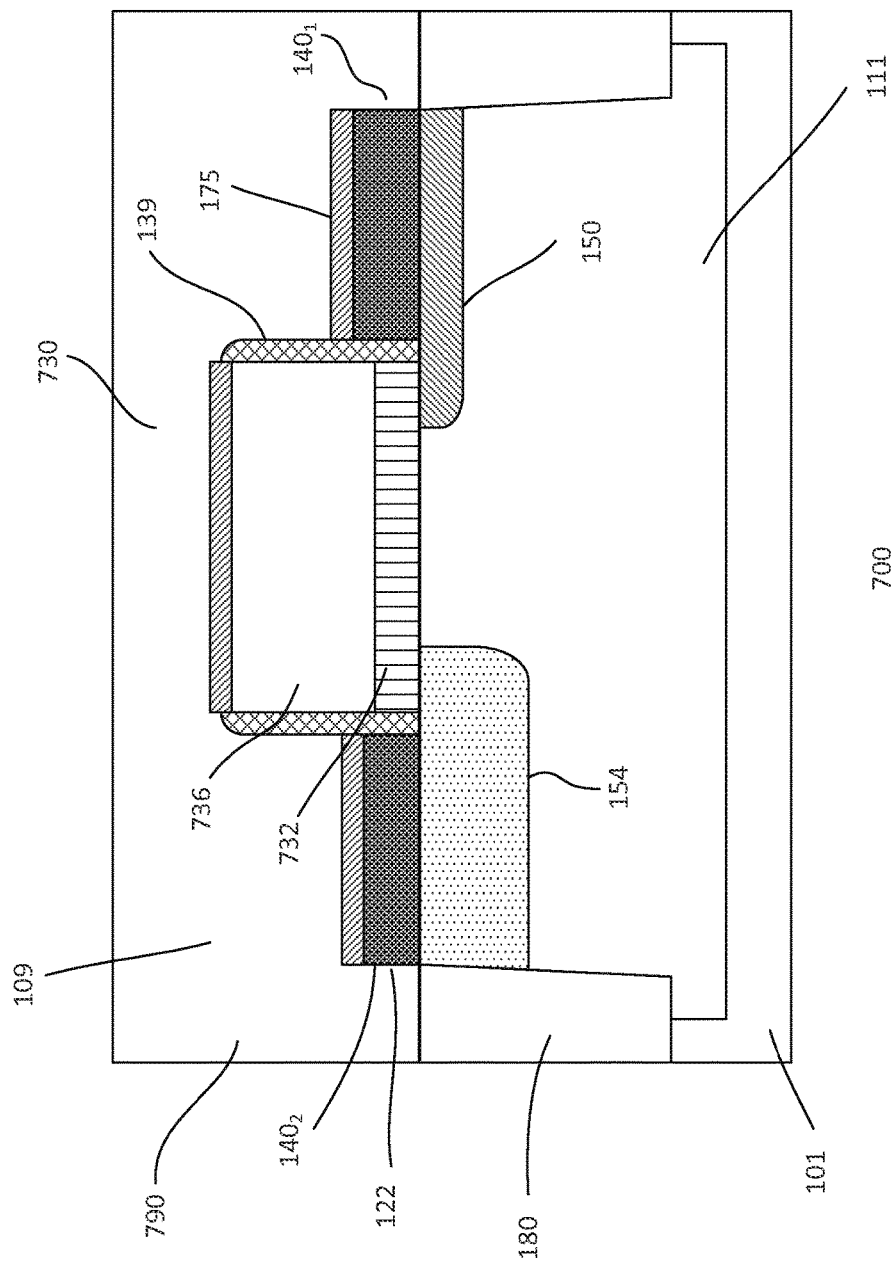

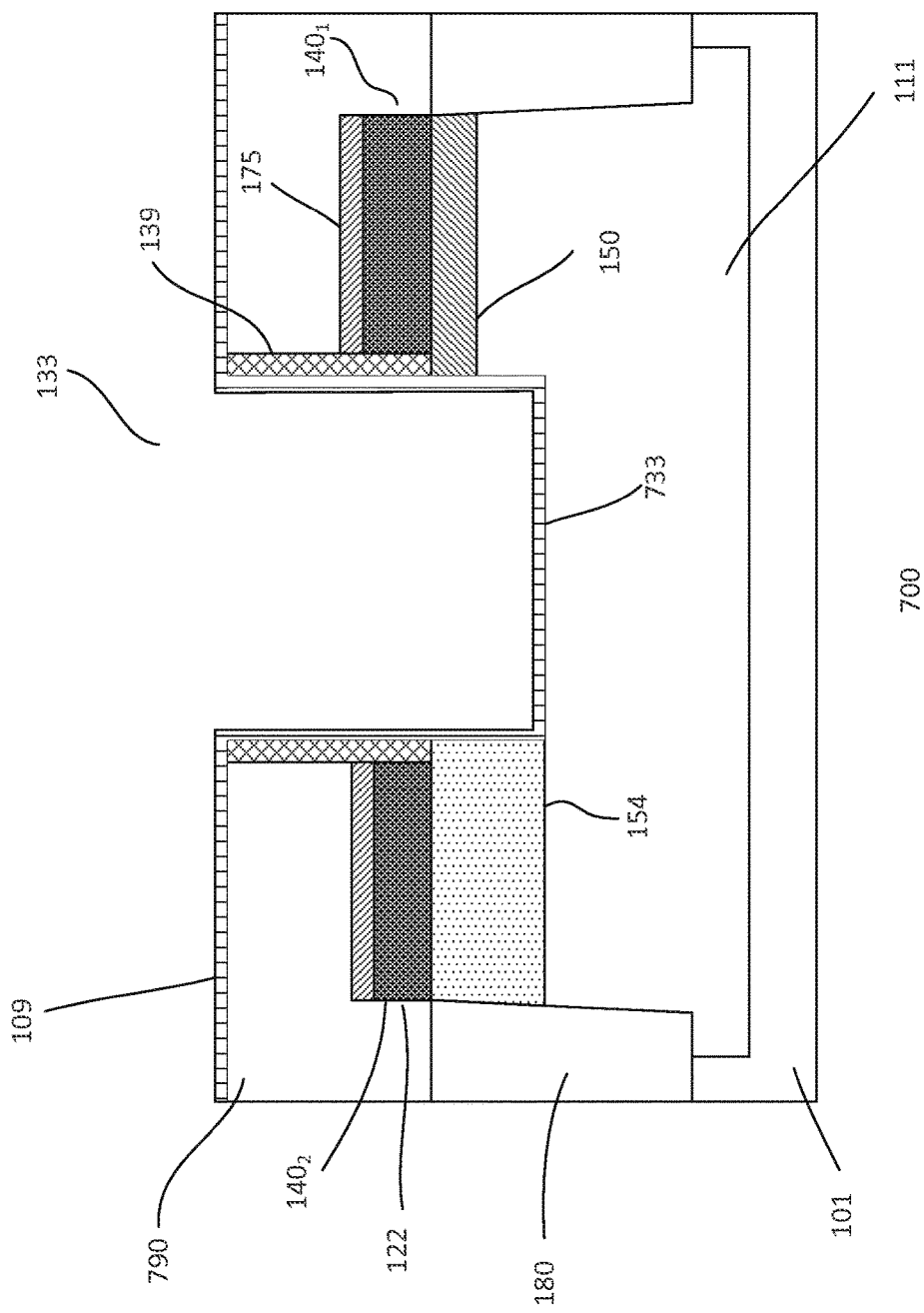

US 9,871,032 B2

GATE-GROUNDED METAL OXIDE SEMICONDUCTOR DEVICE

BACKGROUND

As technology advances, there is a need for logic components implemented with power management functions. However, such components require effective electrostatic discharge (ESD) protection in order to function properly. A gate-grounded metal oxide semiconductor (GGMOS) transistor serves as one of the potential ESD protection devices for these components. For example, n-type GGMOS (GGNMOS) transistors are used as ESD protection devices. However, conventional GGNMOS transistors suffer from several issues, such as early latch up and low holding/snapback voltage. In addition, GGNMOS transistors consume a large area, resulting in a large integrated circuit (IC). This results in scalability issues as well as increased manufacturing costs.

In view of the foregoing, it is desirable to provide a compact GGMOS transistor with improved ESD protection performance without a large footprint.

SUMMARY

In one aspect, a method for forming a device is disclosed. The method includes providing a substrate with a device region. A gate is formed in the device region. A base extension region having second polarity type dopants is formed adjacent to a second side of the gate. First and second source/drain (S/D) regions are formed adjacent to first and second sides of the gate. The first and second S/D regions include first polarity type dopants. Forming the second S/D region includes forming an elevated second S/D region over the base extension region. Interconnections are formed between the second S/D region and the gate with ground to form a GGMOS device.

Another aspect relates to a GGMOS device. The device includes a substrate with a device region. The gate is disposed in the device region. The gate includes first and second sides. A base extension region having second polarity type dopants is disposed adjacent to the second side of the gate. First and second S/D regions are disposed adjacent to the first and second sides of the gate. The second S/D region is an elevated second S/D region disposed adjacent to the second side of the gate over the base extension region. The first and second S/D region include first polarity type dopants. An interconnection connects the second S/D region and the gate to ground.

In yet another aspect, a method for forming a GGMOS device is disclosed. The method includes providing a substrate with a device region. A gate with first and second sides is formed in the device region. A base extension region having second polarity type dopants is formed adjacent to the second side of the gate. First and second S/D regions are formed adjacent to the first and second sides of the gate. The first and second S/D regions include first polarity type dopants. Forming the second S/D region includes forming an elevated second S/D region over the base extension region. Forming the elevated second S/D region includes forming a second S/D epitaxial layer in the device region adjacent to the second side of the gate over the base extension region. Interconnections are formed to connect the gate and second S/D region to ground.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 1a-1g show cross-sectional views of portions of various embodiments of devices;

FIGS. 2a-2m show cross-sectional views of an embodiment of a process for forming a device;

FIGS. 3a-3c show cross-sectional views of another embodiment of a process for forming a device;

FIGS. 4a-4c show cross-sectional views of another embodiment of a process for forming a device;

FIGS. 6a-6d show cross-sectional views of another embodiment of a process for forming a device; and FIGS. 7a-7f show cross-sectional views of yet another embodiment of a process for forming a device.

DETAILED DESCRIPTION

Embodiments generally relate to semiconductor devices or integrated circuits (ICs). More particularly, some embodiments relate to gate-grounded (GG) devices. For example, the GG devices include GG transistors, such as GGMOS transistors. The GGMOS transistors, in one embodiment, are GGNMOS transistors. The GGMOS transistors, for example, are used for ESD protection of input/output (IO) devices. Other uses for the GGMOS transistors may also be useful. The GGMOS transistors can be easily integrated into devices or ICs. The devices or ICs can be incorporated into or used with, for example, electronic products.

Figure 1B:
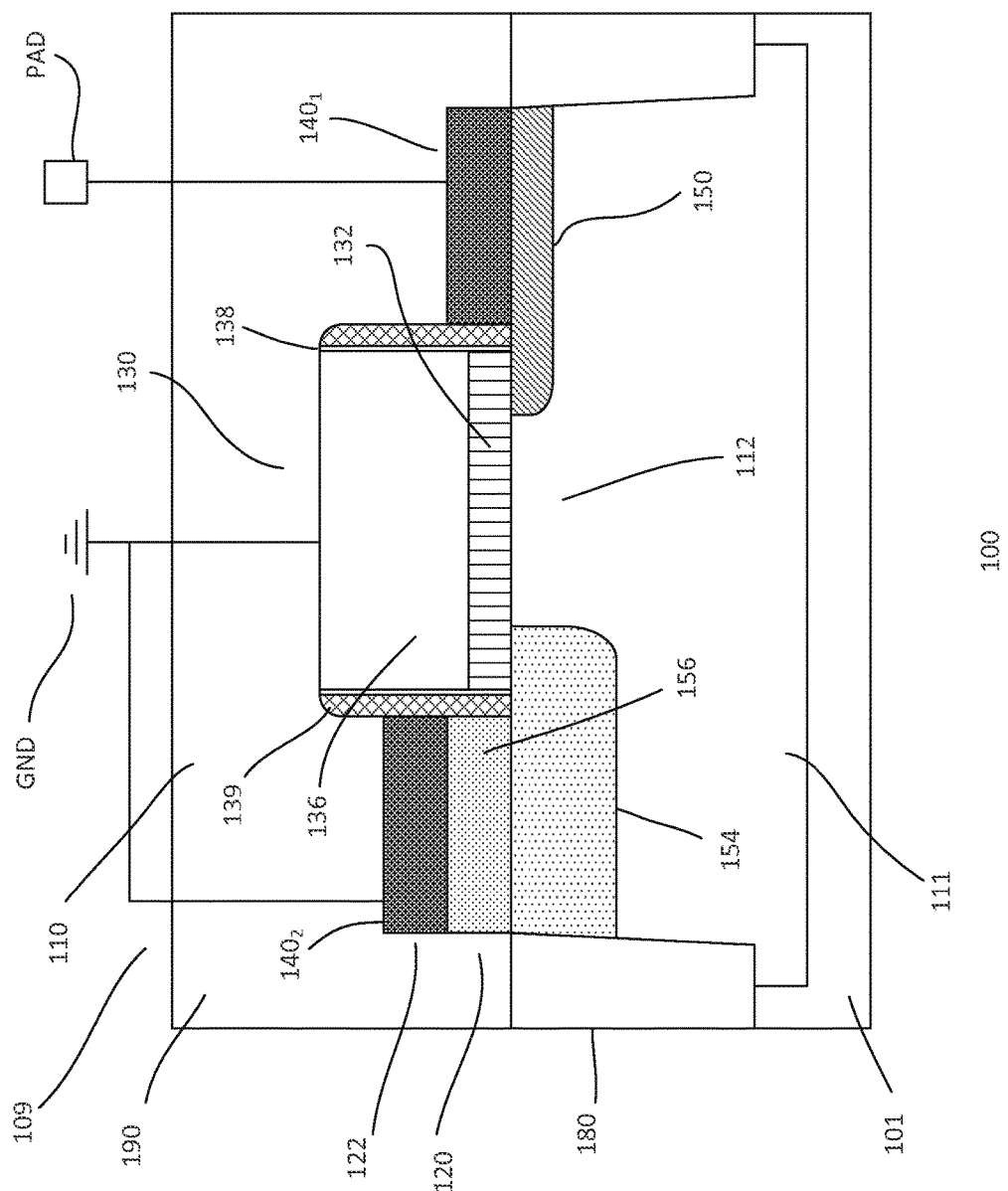

FIGS. 1a-1g show cross-sectional views of various embodiments of devices 100. The device, for example, is an IC. Other types of devices may also be useful. Referring to FIG. 1a, the device includes a substrate 101. The substrate, for example, is a silicon substrate. Other types of substrates, such as silicon germanium, germanium, gallium arsenide, or crystal-on-insulator (COI) such as silicon-on-insulator (SOI), are also useful. The substrate may be a doped substrate. For example, the substrate can be lightly doped with p-type dopants. Providing a substrate with other types of dopants or dopant concentrations, as well as an undoped substrate, may also be useful.

The device may include doped regions having different dopant concentrations. For example, the device may include heavily doped ($x^+$), intermediately doped (x) and lightly doped ($x^-$) regions, where x is the polarity type which can be p or n. A tightly doped region may have a dopant concentration of about $1E14$-$1E17/cm^3$, an intermediately doped region may have a dopant concentration of about $1E17$-$1E19/cm^3$, and a heavily doped region may have a dopant concentration of about $1E19$-$1E21/cm^3$. Providing other dopant concentrations for the different types of doped regions may also be useful. For example, the ranges may be varied, depending on the technology node. P-type dopants may include boron (B), aluminum (Al), indium (In) or a combination thereof, while n-type dopants may include phosphorous (P), arsenic (As), antimony (Sb) or a combination thereof.

The substrate includes a device region 109 for a transistor 110. In one embodiment, the device region is for a GGMOS transistor. In one embodiment, the device region is for a GGNMOS transistor. Providing the device region for other types of GGMOS transistors may also be useful. The transistor, for example, serves as an ESD protection transistor. Other purposes for the transistor may also be useful. The substrate may also include regions for other types of transistors, depending on the type of device or IC. For example, the device may also include regions for both n-type and p-type transistors to form a complementary MOS (CMOS) device. The transistors may also include different voltage transistors, such as high voltage (HV), intermediate voltage (IV) and low voltage (LV) devices as well as other types of devices, such as memory devices. Other configurations of device regions for the device may also be useful.

Isolation regions may be provided for isolating or separating different regions of the substrate. In one embodiment, the device regions are isolated from other regions by isolation regions 180. For example, an isolation region surrounds a device region. The isolation regions, for example, are shallow trench isolation (STI) regions. Other types of isolation regions may also be employed. For example, the isolation regions may be deep trench isolation (DTI) regions. The STI regions, for example, extend to a depth of about 1000-5000 Å. Providing isolation regions which extend to other depths may also be useful.

A device well 111 may be disposed in the device region. The device well is disposed within the isolation region. The device well may be deeper than the isolation region. A depth of the device well may be about 0.1-5 µm. Other depths for the device well may also be useful. In one embodiment, the device well is doped with second polarity type dopants for a first polarity type device. For example, the device well is doped with p-type dopants for a GGNMOS transistor. The device well serves as a body for the transistor. The dopant concentration of the device well may be light to intermediate. For example, the dopant concentration of the device well may be about $1E14$-$1E18$/cm$^3$. Other dopant concentrations for the device well may also be useful. The device well may be biased. For example, the device well may be biased at ground or 0 V. Biasing the device well at other voltages may also be useful. A well tap or contact may be provided to facilitate biasing the device well.

The transistor includes a gate 130 on the surface of the substrate. The gate, for example, includes a gate electrode 136 over a gate dielectric 132. The gate electrode, for example, may be polysilicon. The gate electrode may be about 500-5000 Å thick. The gate electrode may be doped with first polarity type dopants. Other types of gate electrodes as well as thicknesses may also be useful. As for the gate dielectric, it may be silicon oxide. In one embodiment, the silicon oxide is thermal silicon oxide. The gate dielectric may be a thick gate dielectric used in, for example, HV applications, such as ESD protection devices. The thickness of the gate dielectric may be, for example, about 50-300 Å. Other types of gate dielectrics or thicknesses may also be useful.

In other embodiments, the gate may be a metal gate. For example, the metal gate includes a high-K gate dielectric and a metal gate electrode. The high-K gate dielectric may be a Hf-based high-K dielectric, such as $HfO_2$, HfON, Hf—Si—$O_2$ or Hf—SiON, an Al-based high-K or a Zr-based high-K or a combination thereof while the metal gate electrode may be TiN, TaN, TiAlN, TaN/TiN, TaC, TaCN or a combination thereof. Other types or configurations of metal gates may also be useful.

The gate may be a gate conductor. The gate conductor may traverse a plurality of device regions. For example, the gate conductor may serve as a common gate for a row or column of transistors. In other cases, the gate may be an island gate. In such cases, the gate is an individual gate for an individual transistor. Other configurations of gates may also be useful.

Dielectric sidewall spacers 139 are disposed on sidewalls of the gate. The sidewall spacers, for example, may be silicon nitride. In one embodiment, a dielectric liner 138 is provided between the spacers and gate sidewall. The dielectric liner, for example, is silicon oxide. Other types of dielectric materials or combination of materials may be used for the spacers and dielectric liner.

The gate is disposed between first and second S/D regions $140_1$-$140_2$. For example, the first S/D region is adjacent to a first side of the gate and the second S/D region is adjacent to a second side of the gate. The first S/D region $104_1$ may be referred to as the drain while the second S/D region $140_2$ may be referred to as the source. The S/D regions are heavily doped regions with first polarity type dopants. The first polarity type may be n-type. For example, the S/D regions are heavily doped n-type (n$^+$) regions for a GGNMOS transistor. The dopant concentration of the S/D regions may be about $1E19$-$1E21$/cm$^3$. Other dopant concentrations for the doped regions may also be useful.

In one embodiment, the S/D regions are elevated S/D regions. The elevated S/D regions are disposed in epitaxial (epi) layers 122 formed on the surface of the substrate in the device region adjacent to the gate. The epi layer may be epi-silicon. Other types of epi layers may also be useful. The type of epi layer may depend on, for example, the material of the substrate. The height of the epi layer should be sufficient to serve as an S/D region. The height, for example, may be about 10-50 nm. Providing epi layers of other heights or thicknesses may also be useful. The height, for example, may depend on the technology node. Providing an elevated drain increases junction depth which decreases drain resistance to improve performance.

In some embodiments, the first S/D region $140_1$ may be a non-elevated S/D region. For example, the first S/D region may be disposed in the substrate adjacent to a first side of the gate. The first S/D region extends to a depth below a lightly doped (LD) extension region 150. The depth of the first S/D region may be equal to about the depth of S/D regions of transistors of the device with a non-elevated S/D. For example, the depth of the S/D region may be about 10-200 nm from the substrate surface. Other depths for the non-elevated S/D region may also be useful.

The transistor includes a LD extension region 150. The LD extension region may be referred to as a LD drain (LDD) extension region. The LD extension region is disposed in the substrate below the first S/D region $140_1$. The LD extension region is lightly doped with first polarity type dopants. In one embodiment, the LD extension region is lightly doped with n-type (n$^-$) dopants. Providing a p$^-$ LD extension region may also be useful for a p-type transistor. For example, the dopant concentration of the LD extension region is about $1E17$-$1E19$/cm$^3$. Other dopant concentrations for the LD extension region may also be useful. As shown, the LD extension region extends under the gate. The extension should be sufficient to be in communication with a channel 112 of the transistor under the gate. For example, the extension region may extend about 5-20% of the gate length (Lg) under the gate. Extending under the gate by other distances may also be useful. A depth of the LD extension region may be about 0.05-0.3 µm. Providing other depths for the LD extension region may also be useful. For example, the LD extension region may extend below the S/D regions.

In one embodiment, the transistor includes a base extension region 154. The base extension region is disposed in the substrate below the second S/D region $140_2$. The base extension region is doped with second polarity type dopants. For example, the base extension region is doped with p-type dopants for an n-type transistor. In one embodiment, the base extension region is intermediately doped to heavily doped with second polarity type dopants. For example, the base extension region may be a p to $p^+$ region. The dopant concentration may be from about $1E18$-$1E21/cm^3$. Other dopant concentrations for the base extension region may also be useful. Preferably, the base extension region has a high dopant concentration to improve performance. A higher dopant concentration lowers base resistance, improving performance.

The base extension region may extend under the gate. The base extension region may extend about 10-50% of Lg under the gate. Providing an extended base which extends under the gate by other distances may also be useful. In some embodiments, the extended base may be aligned with an outer edge of the dielectric spacer or sidewall of the gate. A depth of the base extension region, as shown, is deeper than the LD extension region. For example, the depth of the base extension region may be about the same depth as S/D regions or extension regions of transistors of the device or IC with non-elevated S/D regions. The depth may be about 0.02-0.5 µm. Providing other depths for the base extension region may also be useful. For example, the depth may be deeper or shallower, such as the same depth as a LD extension region of HV transistor of the same device.

The various contact regions of the transistor may include metal silicide contacts (not shown). For example, the S/D regions and gate electrode may include metal silicide contacts. The silicide contacts, for example, are nickel-based metal silicide contacts. Other types of silicide contacts may also be useful. For example, the metal silicide contacts may be cobalt silicide (CoSi). The metal silicide contacts may be about 50-500 Å thick. Other thicknesses may also be useful.

A dielectric layer 190 is disposed over the substrate. The dielectric layer, for example, serves as a pre-metal dielectric (PMD) layer. The dielectric layer, for example, may be a silicon oxide layer. Other types of dielectric layers which may serve as a PMD layer may also be used. Via contacts (not shown), such as tungsten contacts, may be disposed in the PMD layer. The contacts are in communication with the terminals or contact regions of the transistor.

A dielectric etch stop layer (not shown) may be provided on the substrate. The etch stop layer is disposed between the substrate, including the transistor, and the PMD layer. The etch stop layer, for example, is a silicon nitride etch stop layer. Other types of etch stop layers may also be useful. The etch stop layer should have a material which can be selectively removed from a dielectric layer thereover. The etch stop layer facilitates in forming via contacts or contact plugs to contact regions of the transistor, such as the gate electrode and S/D regions, in the PMD layer. In some embodiments, the etch stop layer may also serve as a stress layer for applying a stress on the channel of the transistor to improve performance.

In one embodiment, the source and gate are commonly coupled to ground (GND). This, for example, forms a GUMS transistor. In one embodiment, the GGMOS transistor is a GGNMOS transistor. As for the drain, it is coupled to a pad. The pad, for example, is an IO pad of the device. The GGMOS transistor, for example, serves as an ESD protection transistor of the device. The device may include numerous pads. In one embodiment, an ESD protection transistor is provided for a pad of the device. For example, each pad includes its respective ESD protection transistor.

FIG. 1b shows another embodiment of a device 100. The device is similar to that described in FIG. 1a. Common elements may not be described or described in detail. As shown, the device includes a substrate 101 with a device region 109 having a transistor 110. The transistor, in one embodiment, is a GGMOS transistor. In one embodiment, the transistor is a GGNMOS transistor. In one embodiment, the transistor includes a base extension region 154 in the substrate (substrate base extension region). The substrate base extension region, as shown, extends under the gate. In addition, the transistor includes an elevated base extension 156. The elevated base extension is disposed in a lower epi layer 120 formed on the surface of the substrate above the base extension region. The lower epi layer abuts the spacer. The lower epi layer, for example, is similar to the epi layer in which the first S/D region $140_1$ is disposed. An upper epi layer 122 is disposed over the lower epi layer. The upper epi layer contains the second S/D region $140_2$. The thickness of the upper epi layer may be the same or similar to the lower epi layer containing the first S/D region.

Figure 1C:
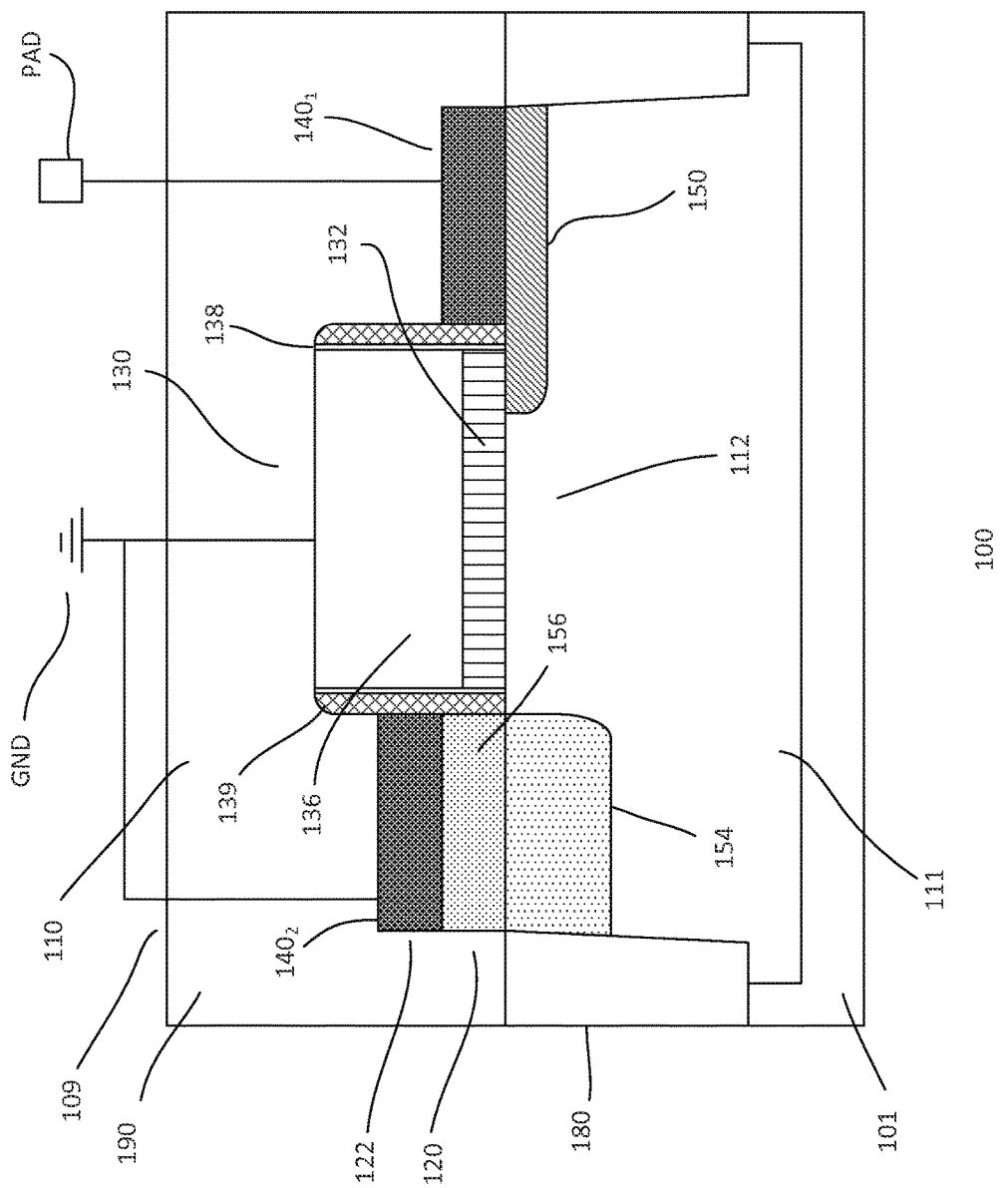

In FIG. 1c, another embodiment of a device 100 is shown. The device is similar to that described in FIG. 1b. Common elements may not be described or described in detail. As shown, the device includes a substrate 101 with a device region 109 having a transistor 110. The transistor, in one embodiment, is a GGMOS transistor. In one embodiment, the transistor is a GGNMOS transistor. In one embodiment, the transistor includes a substrate base extension region 154 in the substrate and an elevated base extension 156. The substrate base extension region, as shown, is aligned with about the outer edge of the spacer. For example, the substrate base extension region does not extend under the gate. In one embodiment, the substrate base extension region may be similar to a second polarity type S/D region or a LD extension region of a transistor with non-elevated S/D regions. The elevated base extension is disposed in a lower epi layer 120 formed on the surface of the substrate above the substrate base extension region.

Figure 1D:
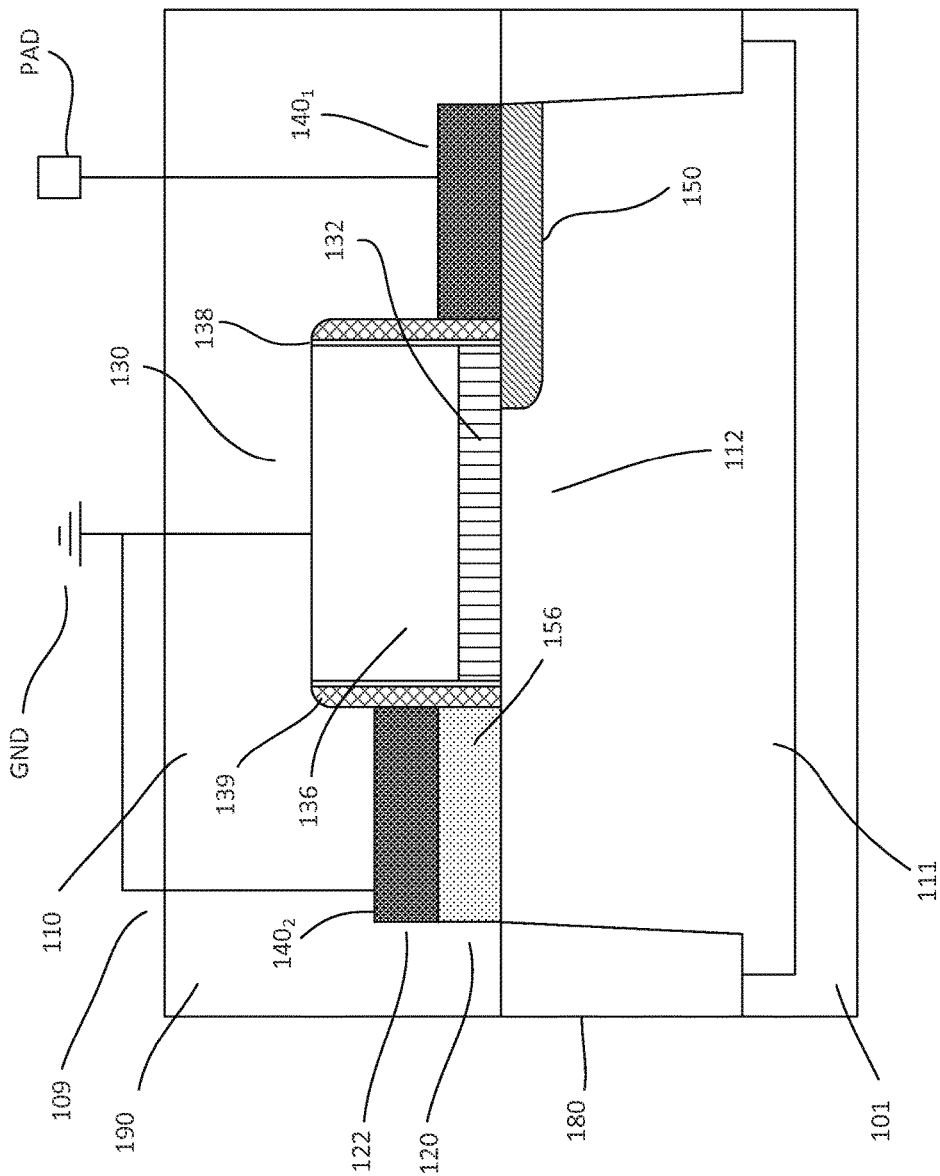

Referring to FIG. 1d, another embodiment of a device 100 is shown. The device is similar to that described in FIG. 1c. Common elements may not be described or described in detail. As shown, the device includes a substrate 101 with a device region 109 having a transistor 110. The transistor, in one embodiment, is a GGMOS transistor. In one embodiment, the transistor is a GGNMOS transistor. In one embodiment, the transistor includes an elevated base extension region 156. The elevated base extension region is disposed in a lower epi layer 120 formed on the surface of the substrate on the source side of the gate. As shown, the transistor does not include a substrate base extension region.

Figure 1E:
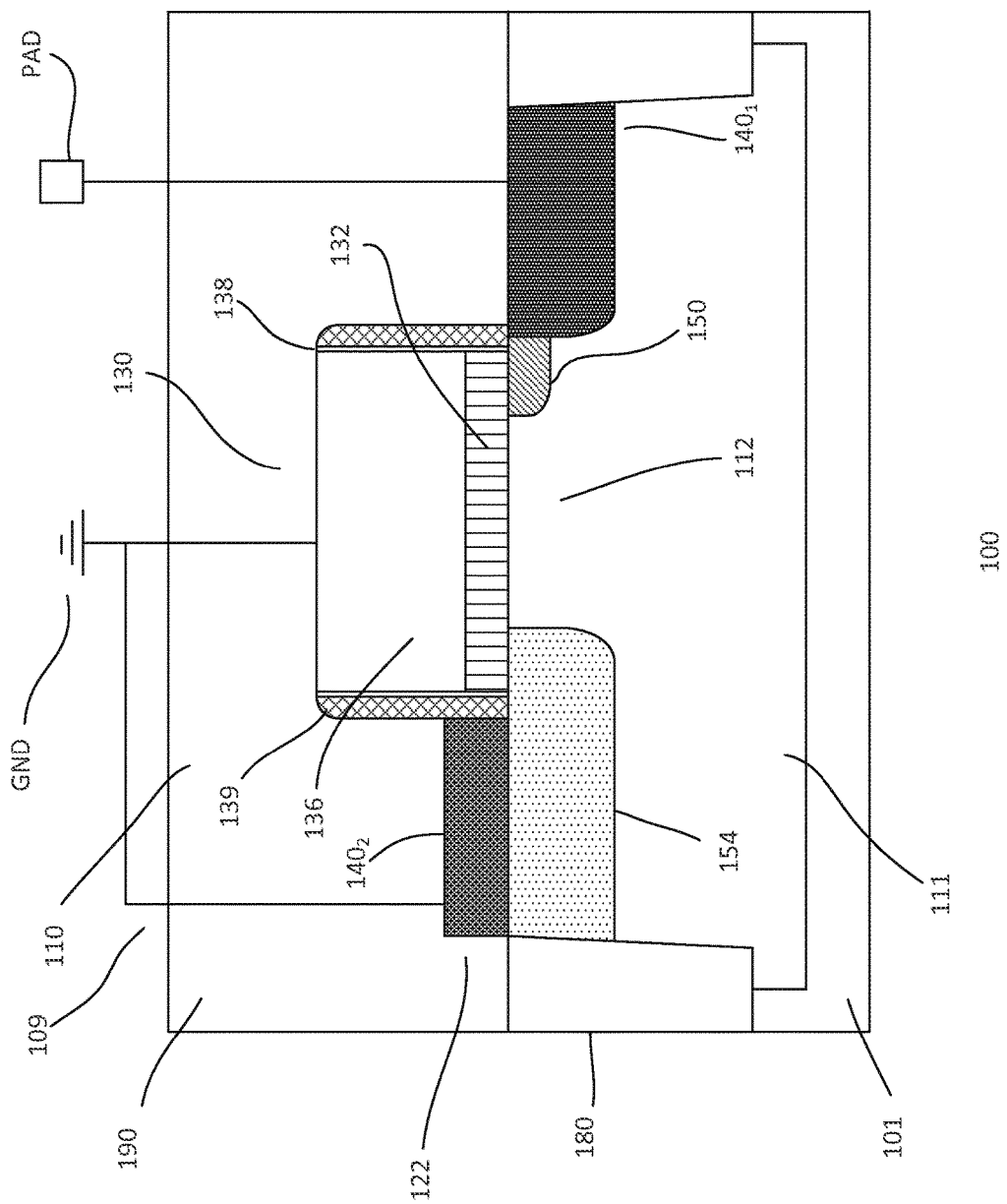

Referring to FIG. 1e, another embodiment of a device 100 is shown. The device is similar to that described in FIG. 1a. Common elements may not be described or described in detail. As shown, the device includes a substrate 101 with a device region 109 having a transistor 110. The transistor, in one embodiment, is a GGMOS transistor. In one embodiment, the transistor is a GGNMOS transistor. In one embodiment, the transistor includes a non-elevated first S/D region $140_1$. For example, the first S/D region is disposed in the substrate and extends to a depth below a LD extension region 150. The depth of the first S/D region may be equal to about the depth of S/D regions of transistors of the device with non-elevated S/D regions. For example, the depth of the first S/D region may be about 10-200 nm from the substrate surface. Other depths for the non-elevated S/D region may also be useful. The second S/D region 140₂ is an elevated S/D region disposed over a substrate base extension region 154.

Figure 1F:
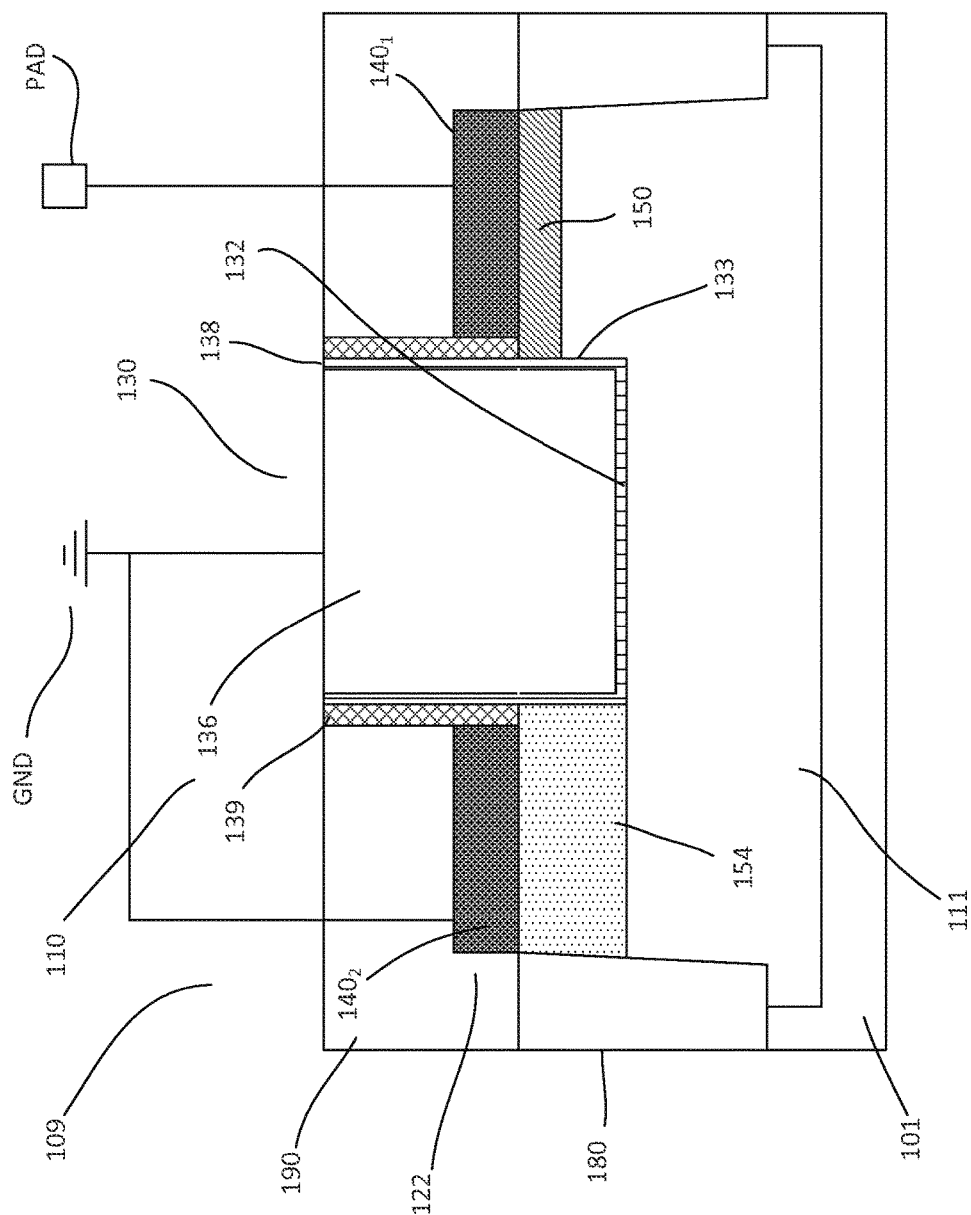

Referring to FIG. 1f, another embodiment of a device 100 is shown. The device is similar to that described in FIG. 1a. Common elements may not be described or described in detail. As shown, the device includes a substrate 101 with a device region 109 having a transistor 110. The transistor, in one embodiment, is a GGMOS transistor. In one embodiment, the transistor is a GGNMOS transistor.

The gate 130, in one embodiment, includes a metal gate. For example, the metal gate includes a high-K gate dielectric 132 and a metal gate electrode 136. In one embodiment, the metal gate is disposed in a gate trench 133. The gate trench, for example, is formed in a dielectric layer 190 and extends into the substrate. As shown, the gate dielectric lines the sidewalls and bottom of the gate trench.

The gate trench may extend to a depth equal to about a depth of the substrate base extension region. For example, the gate trench extends about 20-100 nm below the substrate surface. Extending the gate trench to other depths may also be useful. Extending the gate trench below the substrate surface increases $L_{eff}$. As shown, the edge of the substrate base extension and LD extension regions are aligned to the sidewalk of the gate trench. In some cases, a portion of the substrate base extension portion may extend beyond the sidewall of the gate trench. For example, if the bottom of the gate trench is shallower than the bottom of the base extension region, the base extension region may extend under the gate trench. For example, the transistor of FIG. 1b may be replaced by a metal gate. By providing a substrate base extension region, effective length ($L_{eff}$) of the base is increased.

Figure 1G:
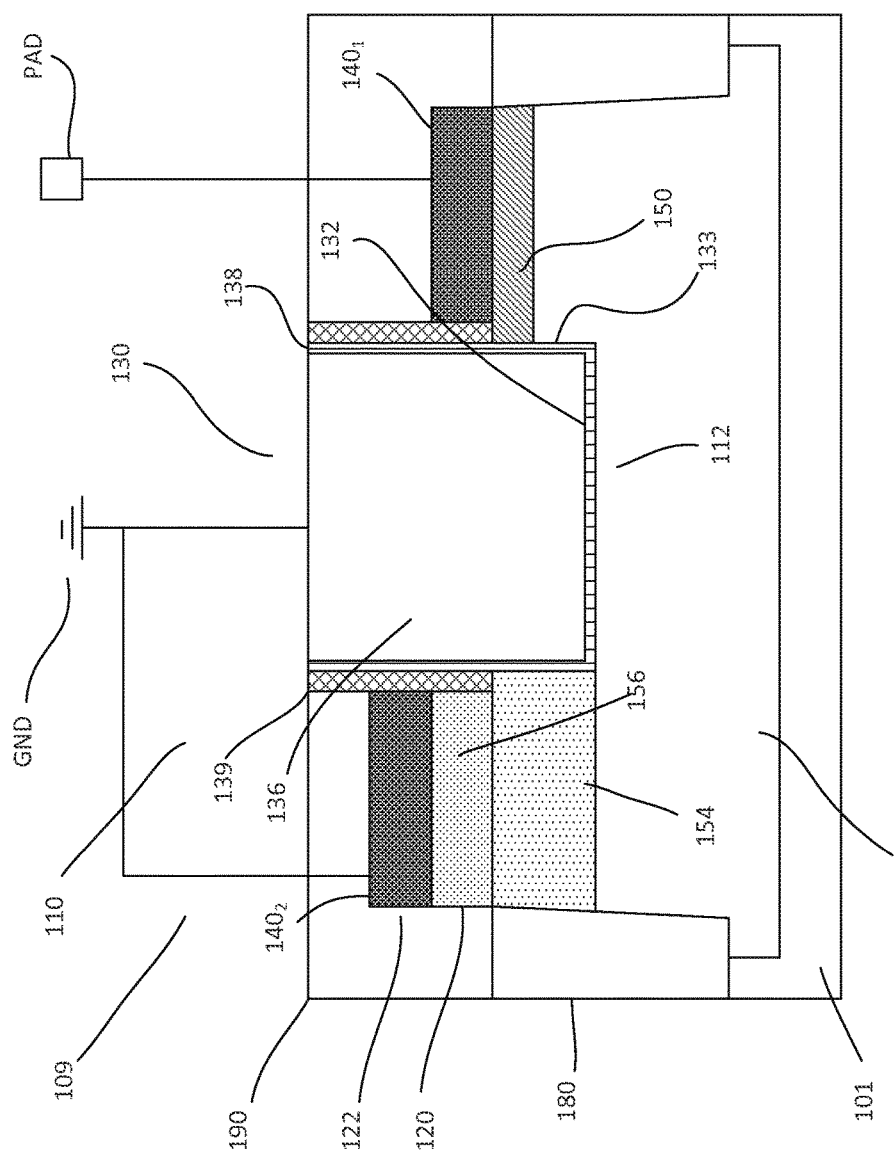

FIG. 1g shows another embodiment of a device 100. The device is similar to that described in FIG. 1f. Common elements may not be described or described in detail. As shown, the device includes a substrate 101 with a device region 109 having a transistor 110. The transistor, in one embodiment, is a GGMOS transistor. In one embodiment, the transistor is a GGNMOS transistor.

The gate 130, in one embodiment, includes a metal gate. For example, the metal gate includes a high-K gate dielectric 132 and a metal gate electrode 136. In one embodiment, the metal gate is disposed in a gate trench 133. The gate trench, for example, is formed in a dielectric layer 190 and extends into the substrate. In one embodiment, the transistor includes an elevated base extension region 156 disposed over the substrate base extension region 154. An elevated second S/D region 140₂ is disposed over the elevated base extension region. By providing a substrate base extension region, $L_{eff}$ of the base is increased. In some embodiments, the drain may be a non-elevated drain.

As described, the GGMOS includes an extended base. The extended base may be an elevated extended base, a substrate extended base or both. The extended base is disposed on the source or grounded side of the transistor. With respect to the extended base, it may have an edge aligned with about the sidewall of the gate or may extend below the gate. In the case of being aligned with the sidewall of the gate, the extended base may be formed when forming S/D region of second polarity type devices. In the case where the extended base extends below the gate, a separate base implant may be used. For an elevated base, it may be a self-aligned extended base formed by in-situ doping during epitaxial growth process. Providing an extended base advantageously increases the $L_{eff}$ of the base, which reduces the gain of the parasitic NPN or PNP (β). This results in a higher holding voltage ($V_H$) which provides good latch up immunity. The $L_{eff}$ may be further increased by employing both elevated and substrate extended bases.

The GGMOS also includes an elevated source. The elevated source advantageously reduces current crowding. In some embodiments, the GGMOS may include an elevated drain. Providing an elevated drain advantageously increases the junction breakdown voltage ($V_{BD}$).

Providing an elevated base extension region along with the substrate base extension region further increases the $L_{eff}$ of the base. This gives an additional decrease in β. It is understood that the various embodiments, whether with polysilicon gate or metal gate, may be implemented with any permutation of extended base and drain configurations.

Figure 2C:
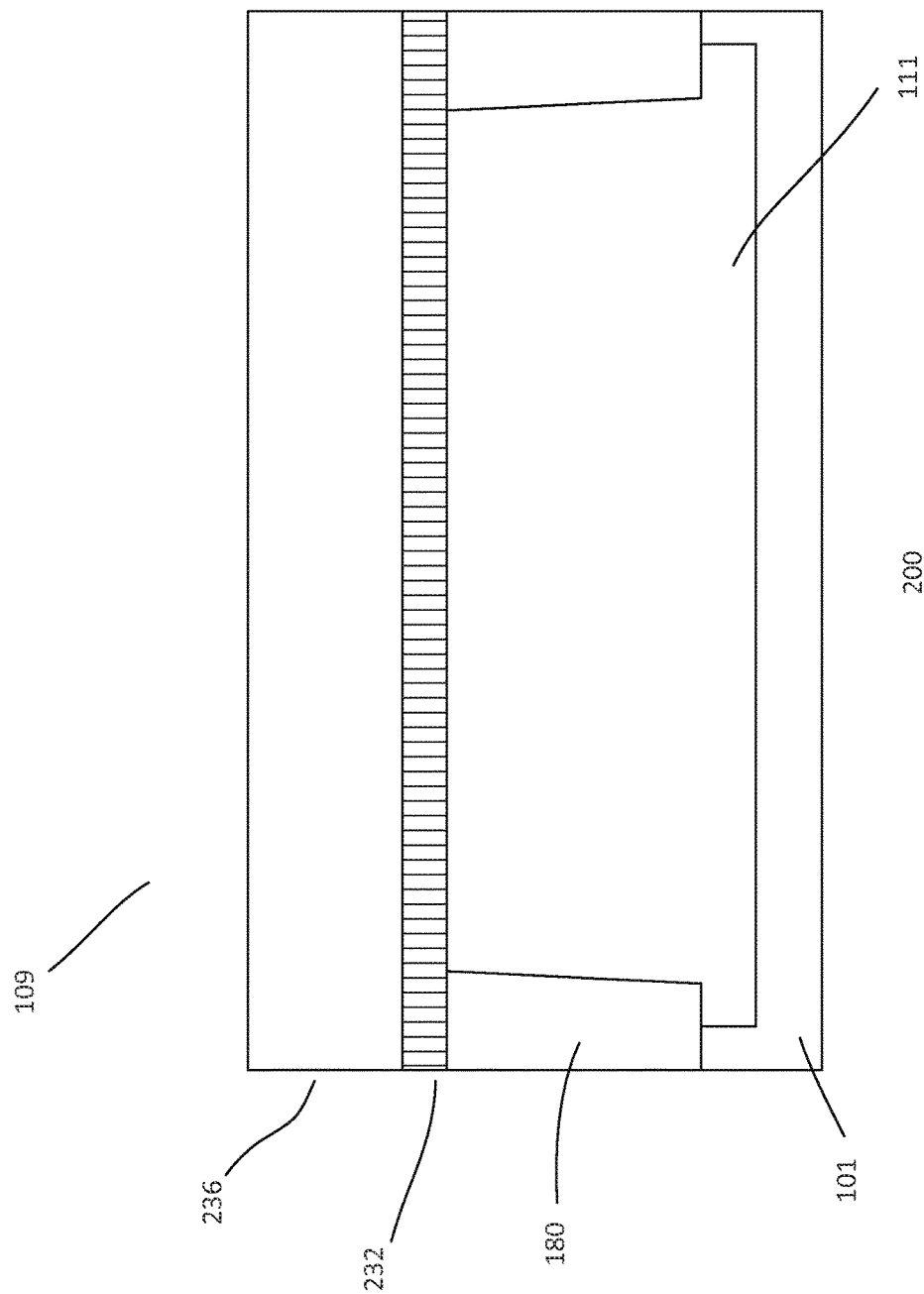

FIGS. 2a-2m show cross-sectional views of an embodiment of a process 200 for forming a device. Referring to FIG. 2a, a substrate 101 is provided. The substrate, in one embodiment, is a silicon substrate. The substrate may be a LD substrate, such as a p⁻ substrate. Other types of substrates, such as a germanium-based, gallium arsenide, COI such as SOI, or sapphire, may also be useful. The substrates may be doped with other types of dopants or dopant concentrations.

The substrate, in FIG. 2b, is processed to form a device region 109 for a transistor 110. In one embodiment, the device region is for a GGMOS transistor. In one embodiment, the device region is for a GGNMOS transistor. Providing the device region for other types of GGMOS transistors may also be useful. The transistor, for example, serves as an ESD protection transistor. Other purposes for the transistor may also be useful.

The substrate may also include regions for other types of transistors, depending on the type of device or IC. For example, the device may also include regions for both n-type and p-type transistors to form a CMOS device. The transistors may also include different voltage transistors, such as HV, IV and LV devices as well as other types of devices, such as memory devices. Other configurations of device regions for the device may also be useful.

The substrate is prepared with an isolation region 180 for isolating the device region from other regions. For example, an isolation region surrounds the device region, isolating it from other device regions (not shown). The isolation region, for example, is a STI region. Other types of isolation regions may also be useful. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. Other processes or materials can also be used to form the STIs. The depth of the STI regions may be, for example, about 1000-5000 Å. Other depths for the STI regions may also be useful.

The substrate is prepared with a device well 111 in the device region. The device well may be formed by ion implantations. To form the device well, an implant mask (not shown) which exposes the device region is used. The implant mask, for example, is a photoresist layer patterned by a lithographic mask. The implant implants dopants into the substrate exposed by the implant mask. In some instances, depending on the depth, multiple implants may be performed to form the device well.

In one embodiment, the device well is doped with second polarity dopants. For example, the device well is doped with p-type dopants for a GGNMOS transistor. The device well serves as a body for the transistor. Depth of the device well may be about 0.1-0.5 µm. Other depths for the device well may also be useful. The dopant concentration of the device well may be light to intermediate. For example, the dopant concentration of the device wells may be about 1E14-1E18/cm$^3$. Other dopant concentrations for the device well may also be useful. The implant mask (not shown) may also expose other device regions for the same polarity type wells. Another implant may be performed using another mask to expose device regions for opposite polarity type device wells (not shown).

Referring to FIG. 2c, gate layers of the gates are formed on the substrate. In one embodiment, the gate layers include a gate dielectric layer 232 on the substrate and a gate electrode layer 236 formed thereon. In one embodiment, the gate dielectric layer is silicon oxide.

The gate dielectric layer may be formed by thermal oxidation. The gate dielectric layer, for example, may be a thick gate dielectric layer having a thickness of about 10-500 Å. Other thicknesses may also be useful. Forming other types of gate dielectric layers or using other processes may also be useful.

As for the gate electrode layer, it may be a silicon layer. The silicon layer, for example, may be a polysilicon layer. The thickness of the gate electrode layer may be about 500-5000 Å. Other thicknesses may also be useful. The gate electrode layer may be formed by, for example, chemical vapor deposition (CVD). Other techniques for forming the gate electrode layer may also be useful. The gate electrode layer can be formed as an amorphous or non-amorphous layer. In the case of an amorphous layer, an anneal process may be performed to form a polycrystalline silicon layer. Other types of gate electrode materials or thicknesses may also be useful. The gate may be pre-doped or in-situ doped with, for example, first polarity type dopants. For example, the gate may be doped with n-type dopants.

In some embodiments, the gate layers may be gate layers of a dummy gate. The gate layers may be the same as that of non-dummy gates. In other cases, different layers may be used to form the dummy gate. Preferably, the gate layers of a dummy gate are the same as that of non-dummy gates. This makes the process compatible with forming transistors with non-dummy gates. Dummy gates are used with, for example, metal gate applications.

The gate layers, in FIG. 2d, are patterned to form a gate 130. The gate includes a gate electrode 136 over a gate dielectric 132. An etch mask may be employed to pattern the gate layers to form the gate. For example, a soft mask, such as a photoresist layer, may be used. An exposure source may selectively expose the photoresist layer through a reticle containing the desired pattern. After selectively exposing the photoresist layer, it is developed to form openings corresponding to locations where the gate layers are to be removed. To improve lithographic resolution, an anti-reflective coating (ARC) may be used below the photoresist layer. Other masking techniques may also be useful.

An anisotropic etch, such as a reactive ion etch (RIE), is performed using the etch mask to pattern the gate layers to form the gates. Other types of etch processes may also be useful. In one embodiment, a RIE is employed to pattern the gate layers to form the gate 130. The gate, for example, may be a gate conductor which serves as a common gate for multiple transistors. Other configurations of the gate may also be useful.

Figure 2E:
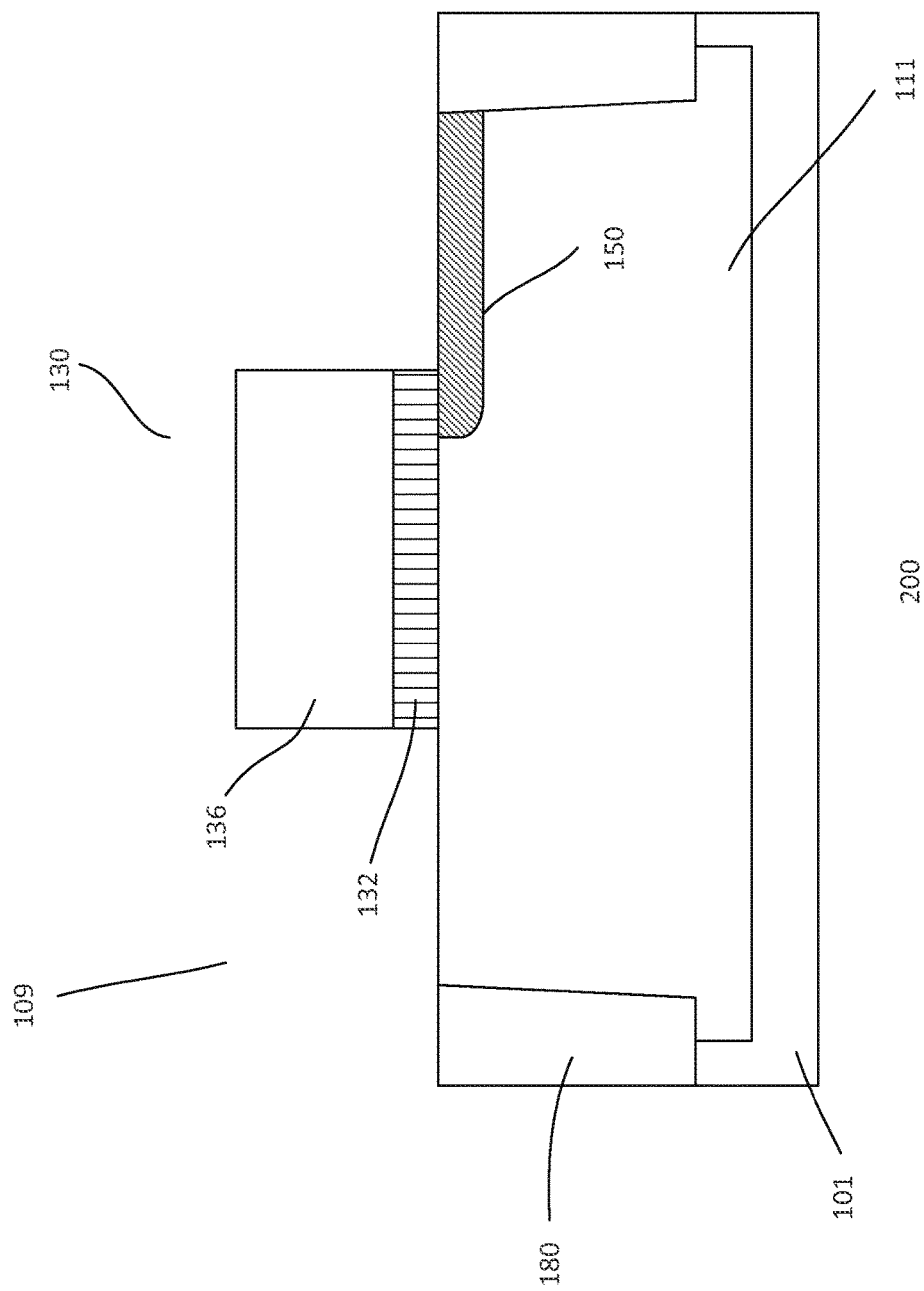

Referring to FIG. 2e, an implant mask (not shown) is formed on the substrate. The implant mask, for example, is a photoresist mask. Other types of masks may also be useful. The mask is patterned to form an opening in the device region to expose the first S/D region while protecting the second S/D region. For example, the implant mask exposes the drain region of the substrate and protects the source region. An ion implantation is performed. The implant implants first polarity type dopants into the substrate, forming a LD extension region 150. The depth of the LD extension region, for example, may be about 10-50 nm from the substrate surface. The implant dose may be about 1E13-1E14/cm$^2$ and the implant energy may be about 2-50 KeV. Other implant parameters may also be useful. Various types of implantation processes may be used. For example, tilt or non-tilt implantation processes may be used. The LD extension region extends under the sidewall of the gate on the drain side. In one embodiment, the LD extension region extends under the gate by about 5-20% of the Lg. Providing a LD extension region which extends under the gate by other distances may also be useful. The implant mask is removed after forming the LD extension region by, for example, ashing.

Figure 2F:
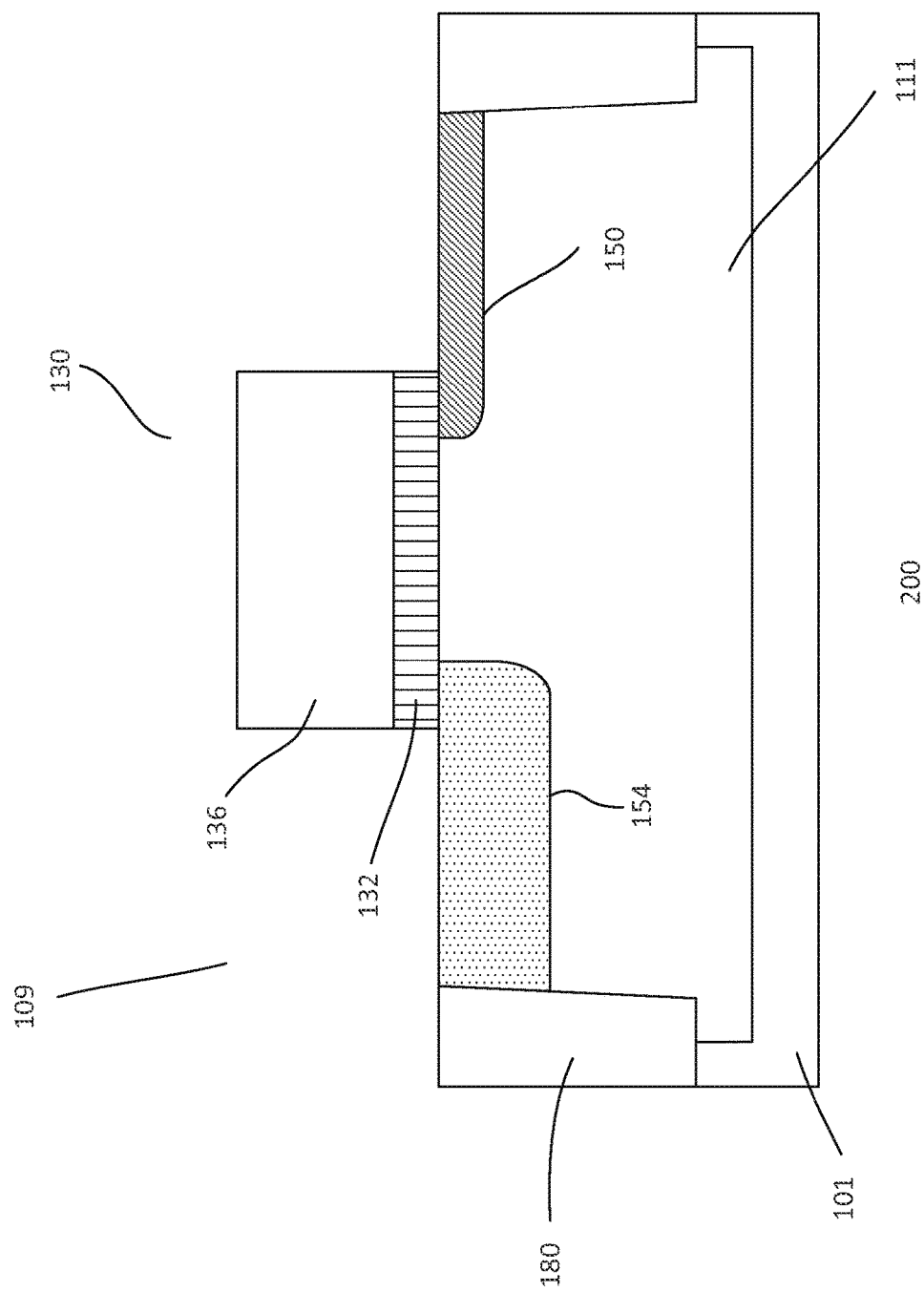

In FIG. 2f, a substrate base extension region 154 may be formed. In one embodiment, forming the substrate base extension region is achieved using a separate base extension implant mask (not shown). The implant mask, for example, is a patterned photoresist layer which exposes the source region of the transistor. Second polarity type dopants are implanted into the substrate using the implant mask, forming the substrate base extension region. Depth of the base extension region, as shown, is deeper than the LD extension region. For example, the depth of the base extension region may be about the same depth as S/D regions or LD extension regions of transistors of the device or IC with non-elevated S/D regions. The depth, for example, may be about 0.02-0.5 µm. Providing other depths for the base extension region may also be useful. The implant dose may be about 1E14-5E15/cm$^2$ and the implant energy may be about 5-50 KeV. Other implant parameters may also be useful. Various types of implantation processes may be used. For example, tilt or non-tilt implantation processes may be used. The substrate base extension region may extend under the sidewall of the gate on the source side. In one embodiment, the substrate base extension region extends under the gate by about 10-50% of the Lg. Providing a substrate base extension region which extends under the gate by other distances may also be useful. The implant mask is removed after forming the base extension region by, for example, ashing. It is understood that the substrate base extension region described in FIG. 2f may be formed prior to forming the LD extension region.

Figure 2G:
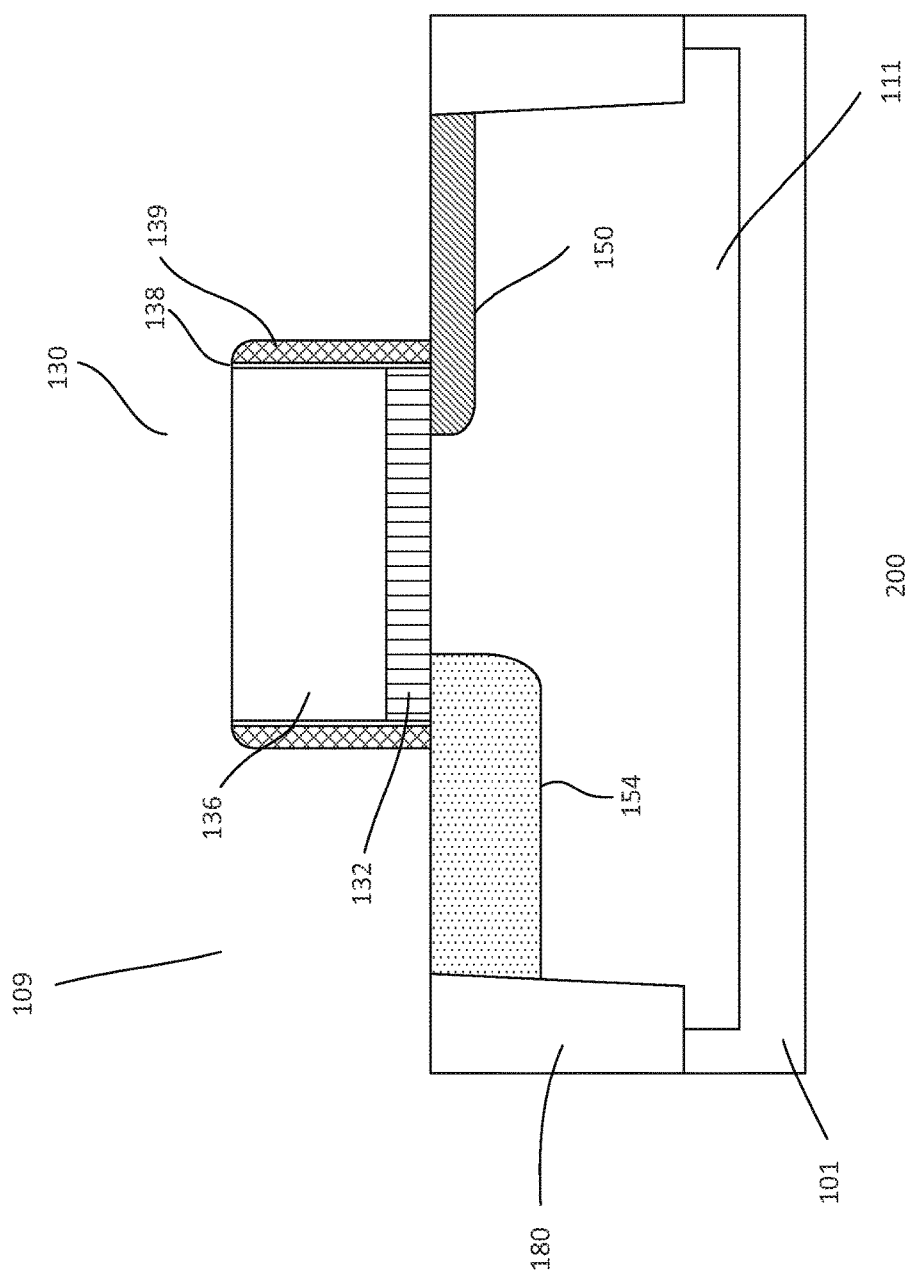

Referring to FIG. 2g, dielectric sidewall spacers 139 are formed. The dielectric sidewall spacers may be silicon nitride spacers. For example, a nitride layer is formed on the substrate by, for example, CVD. The thickness of the dielectric layer may be, for example, 20-500 Å. Other thicknesses for the dielectric layer may also be useful. The thickness, for example, may depend on the desired width of the spacers. An anisotropic etch, such as a RIE, may be performed to remove horizontal portions of the dielectric layer, leaving spacers on the sidewalls of the gate. Other types of dielectric spacers may also be useful.

In one embodiment, a dielectric liner 138 is provided prior to forming the spacers. The dielectric liner, for example, may be silicon oxide. In one embodiment, the dielectric liner is formed by oxidizing the gate sidewalls. Other techniques for forming the liner may also be useful. The portion of the liner at the top of the gate may be removed during the process for forming the dielectric spacers.

Figure 2H:
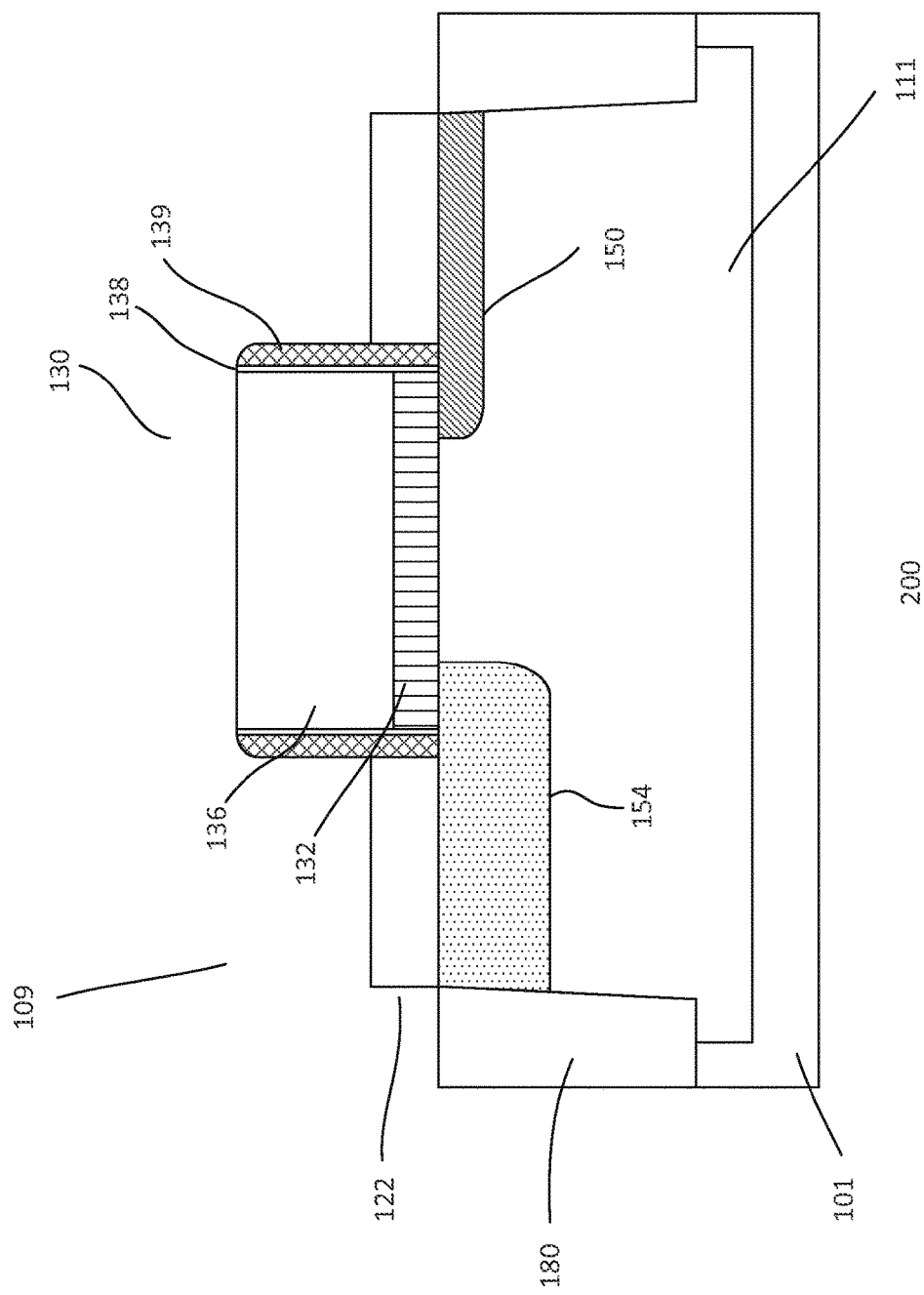

As shown in FIG. 2h, the process continues to form S/D regions. In one embodiment, the process forms elevated S/D regions. The process includes forming epi layers 122 over the S/D regions of the substrate adjacent to the gate. For example, the epi layers are formed on exposed portions of the substrate over the LD and substrate base extension regions adjacent to the gate. The epi layers may be silicon epi layers. The epi layer may be formed by selective epitaxial growth (SEG). Other techniques for forming the epi layers may also be useful. The height of the epi layers should be sufficient to serve as S/D regions. The height, for example, may be about 10-50 nm. Providing epi layers with other heights or thicknesses may also be useful. The height, for example, may depend on the technology node.

Figure 2I:
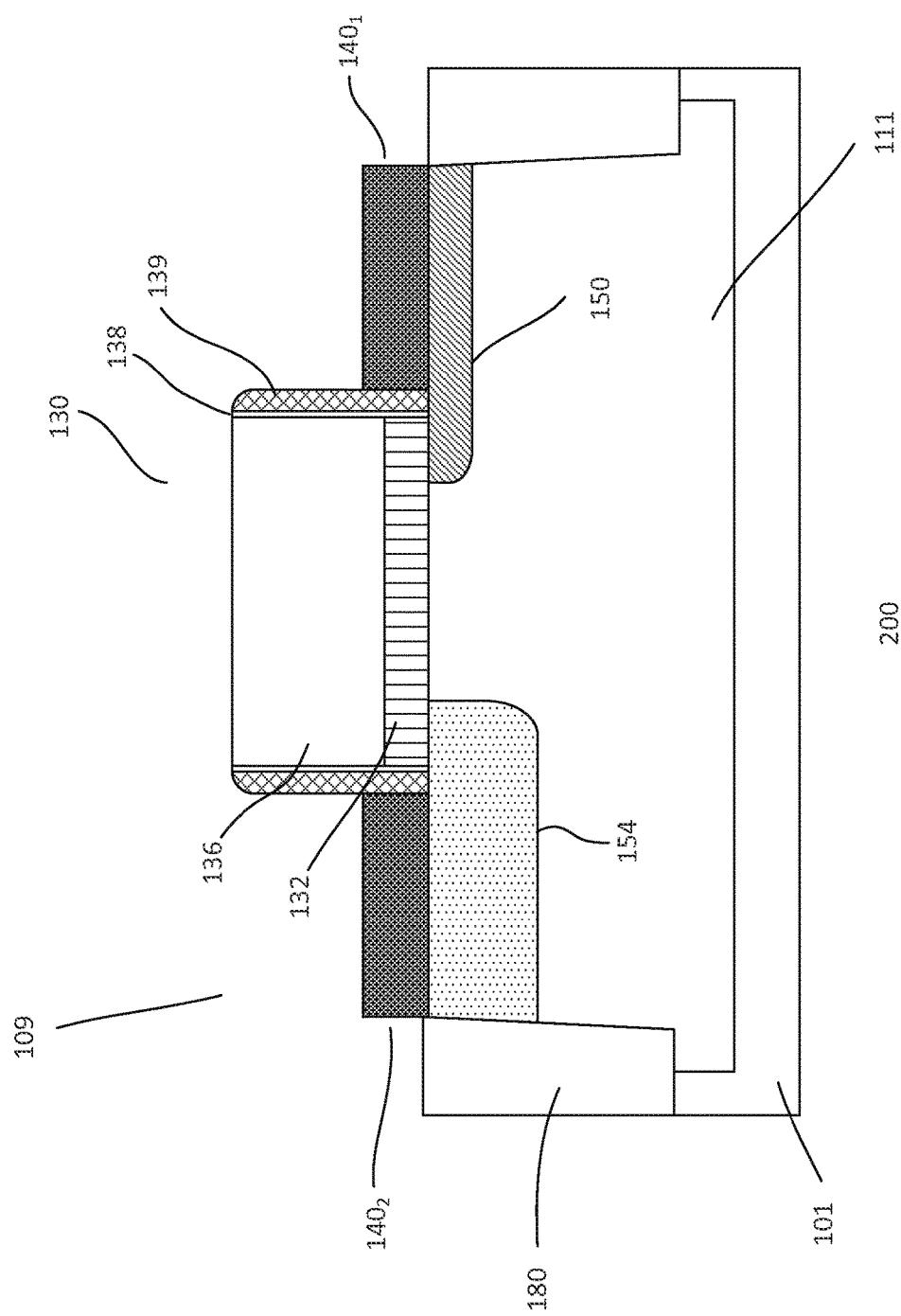

Referring to FIG. 2i, heavily doped S/D regions $140_1$-$140_2$ are formed in the epi layers. The S/D regions are heavily doped regions with first polarity type dopants. The first polarity type may be n-type. For example, the S/D regions are heavily doped n-type ($n^+$) regions for a GGNMOS transistor. The dopant concentration of the S/D regions may be about $1E19$-$1E21/cm^3$. Other dopant concentrations for the doped regions may also be useful. In one embodiment, the S/D regions may be funned by in-situ doping during SEG. Doping the epi layers by ion implantation or a combination of both in-situ doping and ion implantation may also be useful to form the elevated S/D regions. Other techniques for forming the S/D regions may also be useful. An anneal process, such as rapid thermal annealing (RTA), is performed after the ion implantation to activate the dopants in the S/D regions. The inner edges of the doped regions, for example, may extend under the dielectric spacers due to diffusion of the dopants from the doped regions.

Figure 2J:
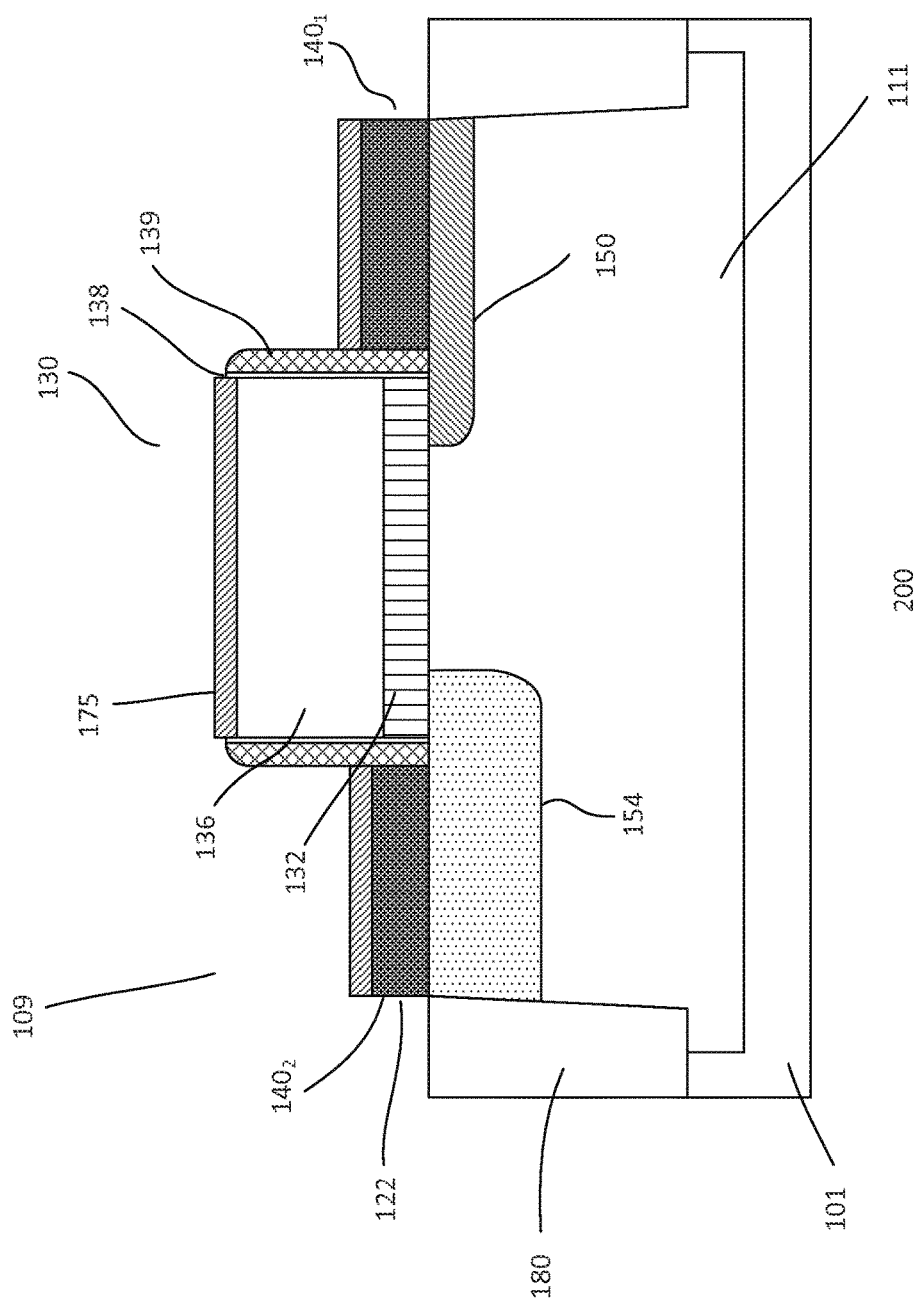

Referring to FIG. 2j, metal silicide contacts 175 are formed on contact regions of the transistor. For example, the metal silicide contacts are formed on the gate and S/D regions of the transistor. The metal silicide contacts, for example, are nickel based metal silicide contacts. Other types of metal silicide contacts may also be useful. The metal silicide contacts are used to facilitate low resistance contacts between the active substrate and back-end-of-line (BEOL) metal lines. In one embodiment, the thickness of the metal silicide contacts is about 50-500 Å. Providing other thicknesses for the metal silicide contacts may also be useful.

To form the silicide contacts, a metal layer is deposited on the surface of the substrate. The metal layer, for example, may be nickel or an alloy thereof. Other types of metal layers, such as cobalt, or alloys thereof, including nickel, may also be used. The metal layer can be formed by physical vapor deposition (PVD). Other types of metal layers and/or processes may also be useful.

An anneal process may be performed to cause a reaction between the metal and the substrate, forming a silicide layer. Excess metal not reacted in the silicidation of the active surface is removed by, for example, a wet removal process. For example, unreacted metal material is removed selective to the silicide contacts. Other techniques for forming the metal silicide contacts may also be useful.

Figure 2K:
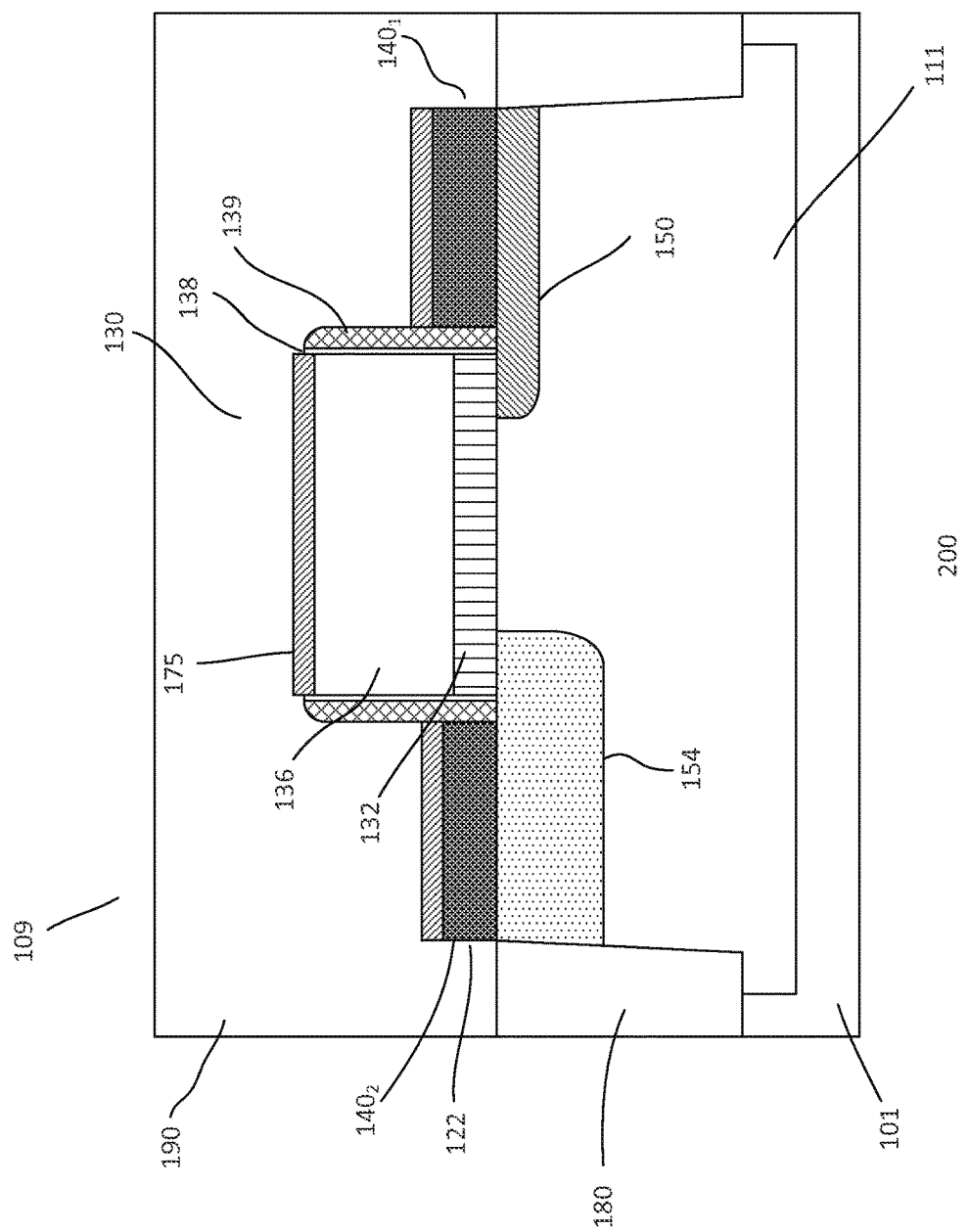
Figure 2I:
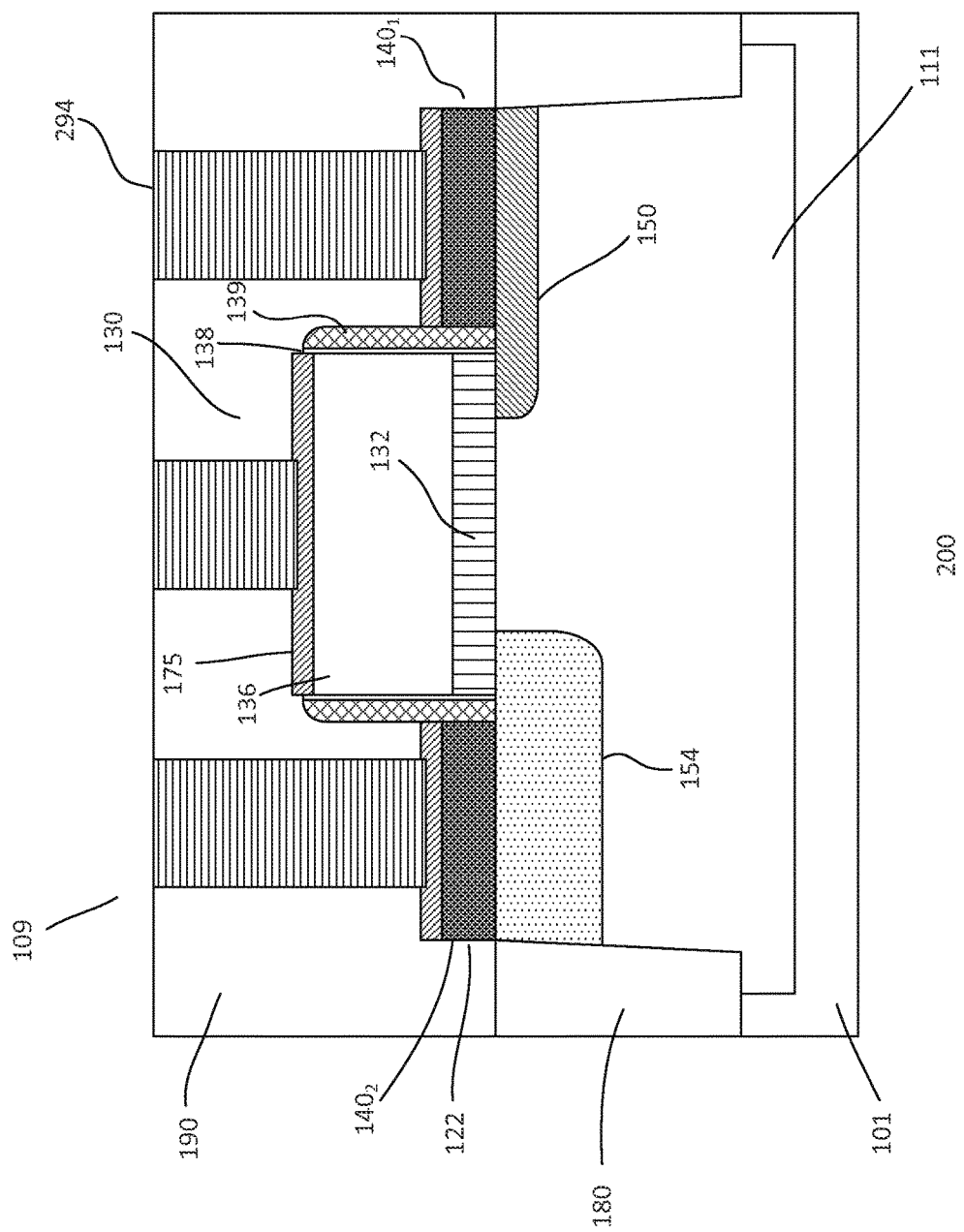

In FIG. 2k, the process continues to form the device. For example, a BEOL processing is performed. The BEOL processing includes forming a dielectric layer 190 on the substrate, covering the transistor. The dielectric layer serves as, for example, a PMD layer, which commences the BEOL processing. The dielectric layer, for example, may be silicon oxide. Other types of dielectric materials may also be useful. The dielectric layer may be formed by, for example, CVD. Other deposition techniques, such as high aspect ratio process (HARP) or spin on techniques may also be useful.

In some embodiments, a dielectric etch stop layer (not shown) may be formed over the transistors. The etch stop layer, for example, is a silicon nitride etch stop layer. Other types of etch stop layers may also be useful. The etch stop layer should have a material which can be selectively removed from a dielectric layer thereover. The etch stop layer facilitates in forming contact plugs to contact regions of the transistor. In some embodiments, the etch stop layer may also serve as a stress layer for applying a stress on the channel of the transistor to improve performance.

Referring to FIG. 2l, via contacts 294, such as tungsten contacts, may be formed in the PMD layer. The via contacts are coupled to the terminals or contact regions of the transistors. For example, the via contacts are coupled to the S/D regions and gate of the transistor. A via contact may also be formed for a well contact for biasing the device well. Via contacts are also formed for other transistors and well contacts of the device or IC.

To form the via contacts, via openings are patterned in the dielectric layer 190. For example, a via mask (not shown), such as photoresist may be used. The via mask is patterned to expose portions of the dielectric layer where via openings are formed. An anisotropic etch, such as a RIE, is used to form the via openings. The via openings expose contact regions of the transistor. A conductive layer is deposited on the substrate, filling the via openings. For example, a tungsten layer may be formed by sputtering to fill the via openings. A planarizing process, such as CMP, is performed to remove excess conductive material, forming the via contacts.

Figure 2M:
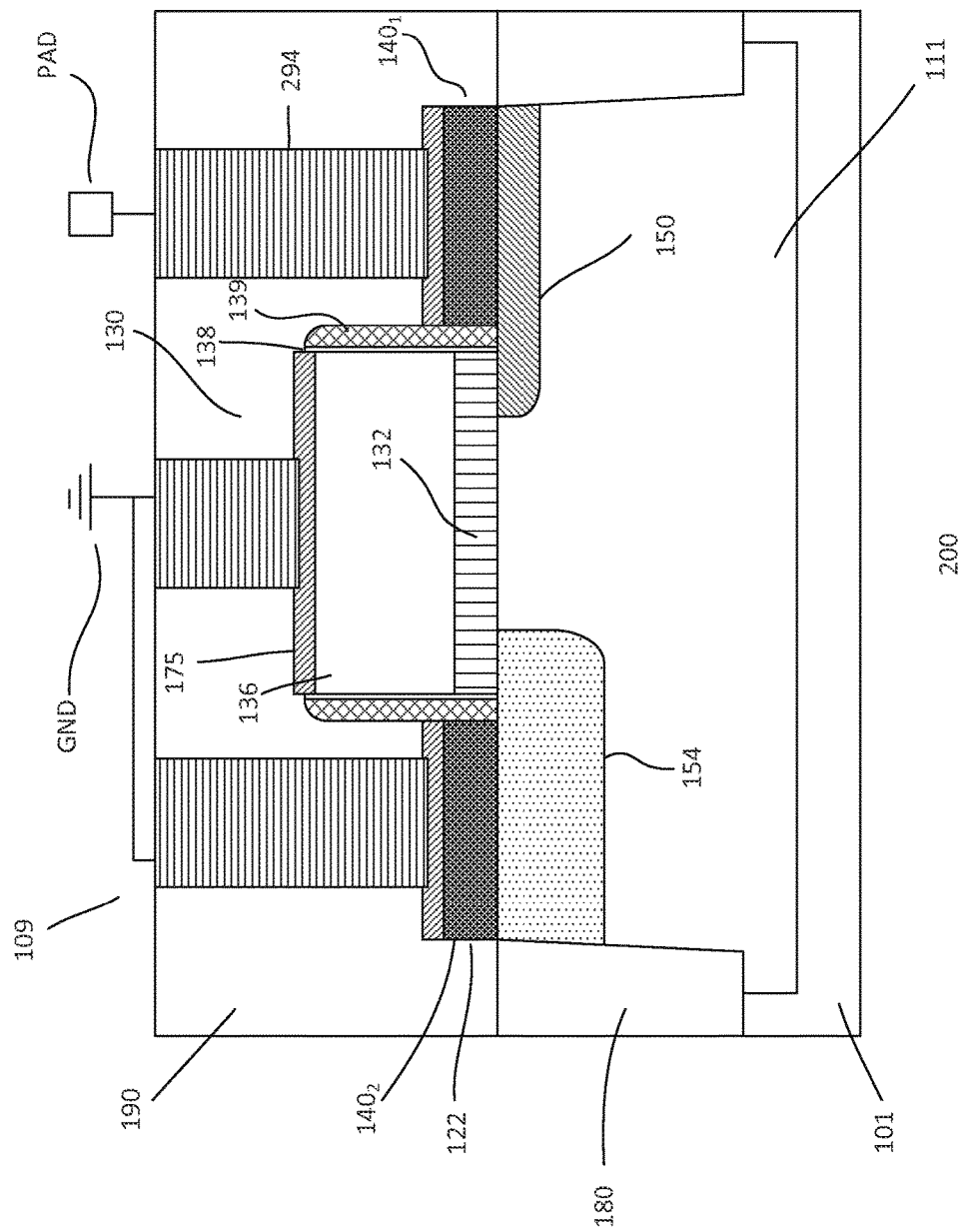

In FIG. 2m, interconnections are formed to the terminals of the transistor. As shown, the gate and source terminals of the transistor are commonly coupled to ground to form a GGMOS transistor. In one embodiment, the drain terminal is coupled to a pad of the device or IC. Interconnects, for example, include one or more metal levels disposed over the PMD layer. For example, a dielectric layer (not shown) is formed over the PMD layer. The dielectric layer may be silicon oxide. The dielectric layer may be formed by, for example, CVD. Other types of dielectric layers or forming techniques may also be useful. The dielectric layer, for example, serves as a first metal level (M1) of the device. Metal interconnects (not shown), such as copper interconnects may be formed in the first metal dielectric layer. The metal interconnects may be formed using, for example, a damascene technique. Other techniques for forming metal interconnects may also be useful.

Forming metal interconnects by the damascene technique includes forming trenches in the dielectric layer. The trenches may be formed by, for example, etching the dielectric layer by a RIE using an etch mask, such as photoresist. After forming the trenches, the etch mask is removed. The trenches are filled with conductive material, such as copper or copper alloy. For example, the trenches are filled with conductive material using plating techniques. Other types of conductive materials or filling techniques may also be useful. A planarizing process, such as CMP, is performed to remove excess conductive material, forming the metal interconnects.

Additional interconnect levels (not shown) may be formed over M1. An additional interconnect level, for example, includes contacts in a via level and interconnects in a metal level (not shown) of an interlevel dielectric (ILD) layer. For example, dual damascene techniques may be employed in an ILD layer to form via contacts and interconnects. After the top interconnect level is formed, a pad level may be formed. The pad level includes pad contacts for external connection. Thereafter, final passivation, dicing, assembly and packaging may be performed. Other processes or alternative processes may also be included to complete the device or IC.

Figure 3C:
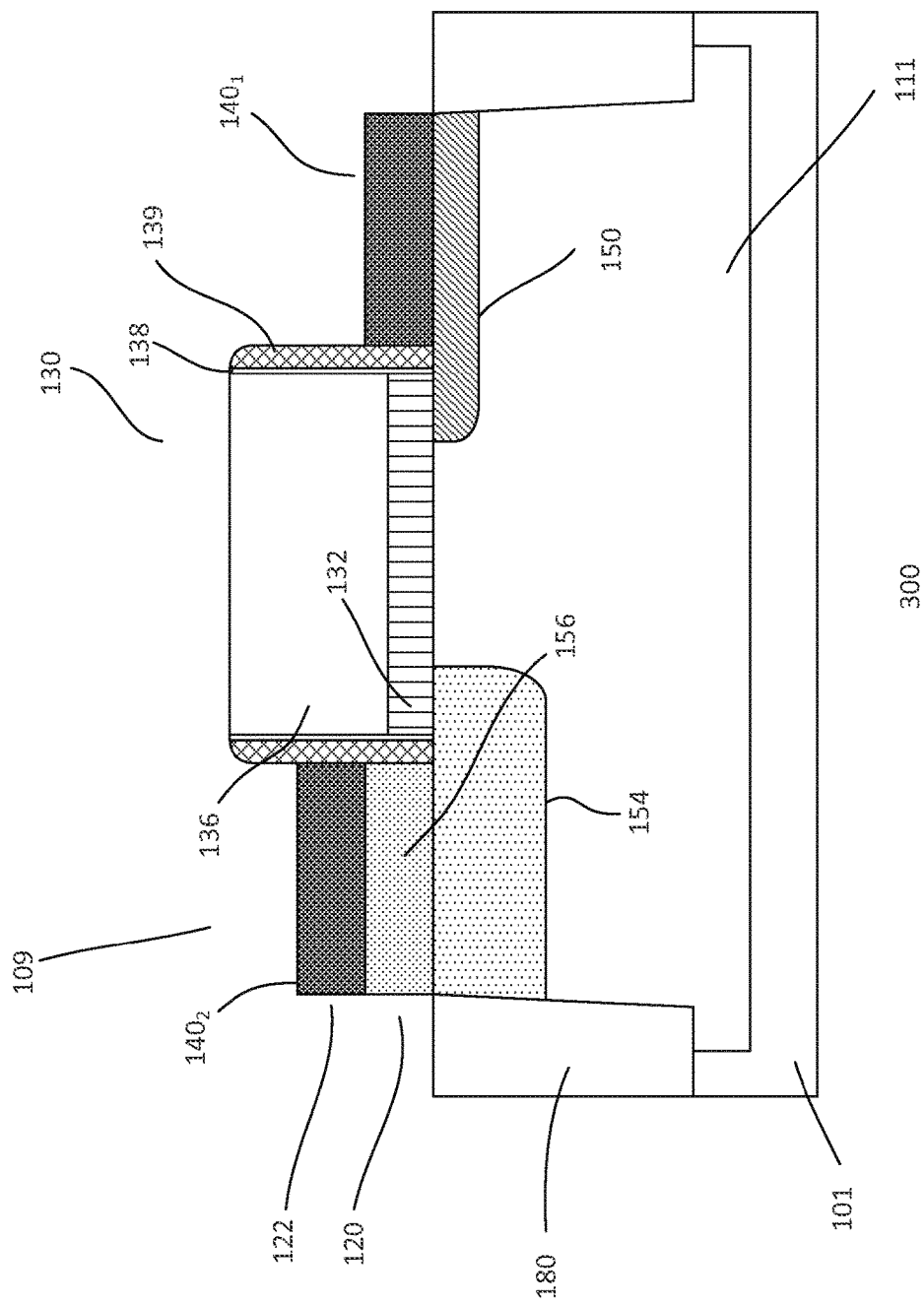

FIGS. 3a-3c show another embodiment of a process 300 for forming a device. The process is similar to that described in FIGS. 2a-2m. Common elements may not be described or described in detail. As shown in FIG. 3a, the device is at the stage of processing as described in FIG. 2g. For example, the process forms a transistor with a gate 130 having dielectric spacers 139 disposed on its sidewalls. A dielectric liner 138 is disposed between the gate sidewalls and spacers. A LD extension region 150 is disposed in the substrate adjacent to a first side of the gate and a substrate base extension region 154 is disposed adjacent to a second side of the gate. The edge of the base extension region may extend below the gate or aligned with about the edge of the dielectric spacer. Other configurations of the substrate base extension region may also be useful.

Referring to FIG. 3b, an elevated base extension region 156 is formed. In one embodiment, forming the elevated base extension region includes forming a lower epi layer 120 on the substrate. An epi mask (not shown) may be provided over the substrate. The epi mask, for example, may be a dielectric mask, such as an oxide or nitride mask. Other types of dielectric masks may also be useful. The epi mask exposes, for example, the substrate base extension region adjacent to the second side of the gate. This corresponds to the second S/D region. A SEG process is performed to form the lower epi layer on the substrate over, for example, the substrate base extension region. The height of the lower epi layer should be sufficient to serve as an elevated extension region. The height, for example, may be about 10-50 nm. Providing an epi layer having other heights or thicknesses may also be useful. The height, for example, may depend on the technology node.

The lower epi layer is doped with second polarity type dopants. The second polarity type may be p-type. For example, the elevated base extension region is a p-type doped region for a GGNMOS transistor. The elevated base extension region may be an intermediately doped to a heavily doped region. For example, the elevated base extension region may have a dopant concentration of about $1E19$-$1E21/cm^3$. Other dopant concentrations for the elevated base extension region may also be useful.

In one embodiment, the base extension region may be doped by in-situ doping during SEG. Doping the epi layer by ion implantation or a combination of both in-situ doping and ion implantation may also be useful to form the elevated base extension region. Other techniques for forming the base extension region may also be useful.

As shown in FIG. 3c, elevated S/D regions $140_1$-$140_2$ are formed adjacent to first and second sides of the gate. The elevated S/D regions may be formed similarly as the elevated base extension region. For example, S/D epi layers 122 may be formed. The first S/D epi layer may be formed over the LD extension region while the second S/D epi layer may be formed over the elevated base extension region. To facilitate SEG of the S/D epi layers, an epi mask may be used. The epi mask exposes the first and second S/D regions of the device region. The process continues as previously described from FIG. 2j and onwards.

Figure 4A:
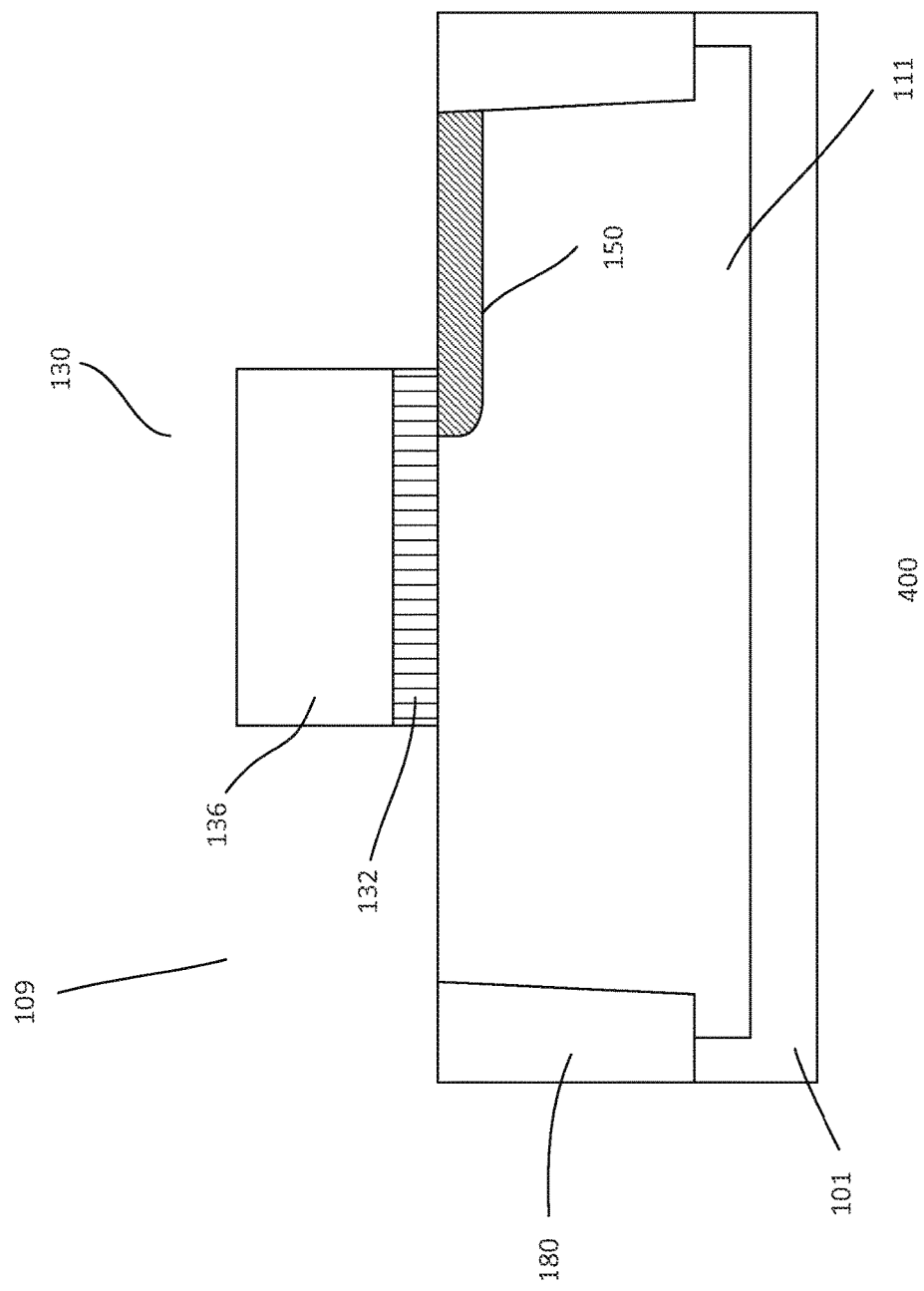
Figure 4C:
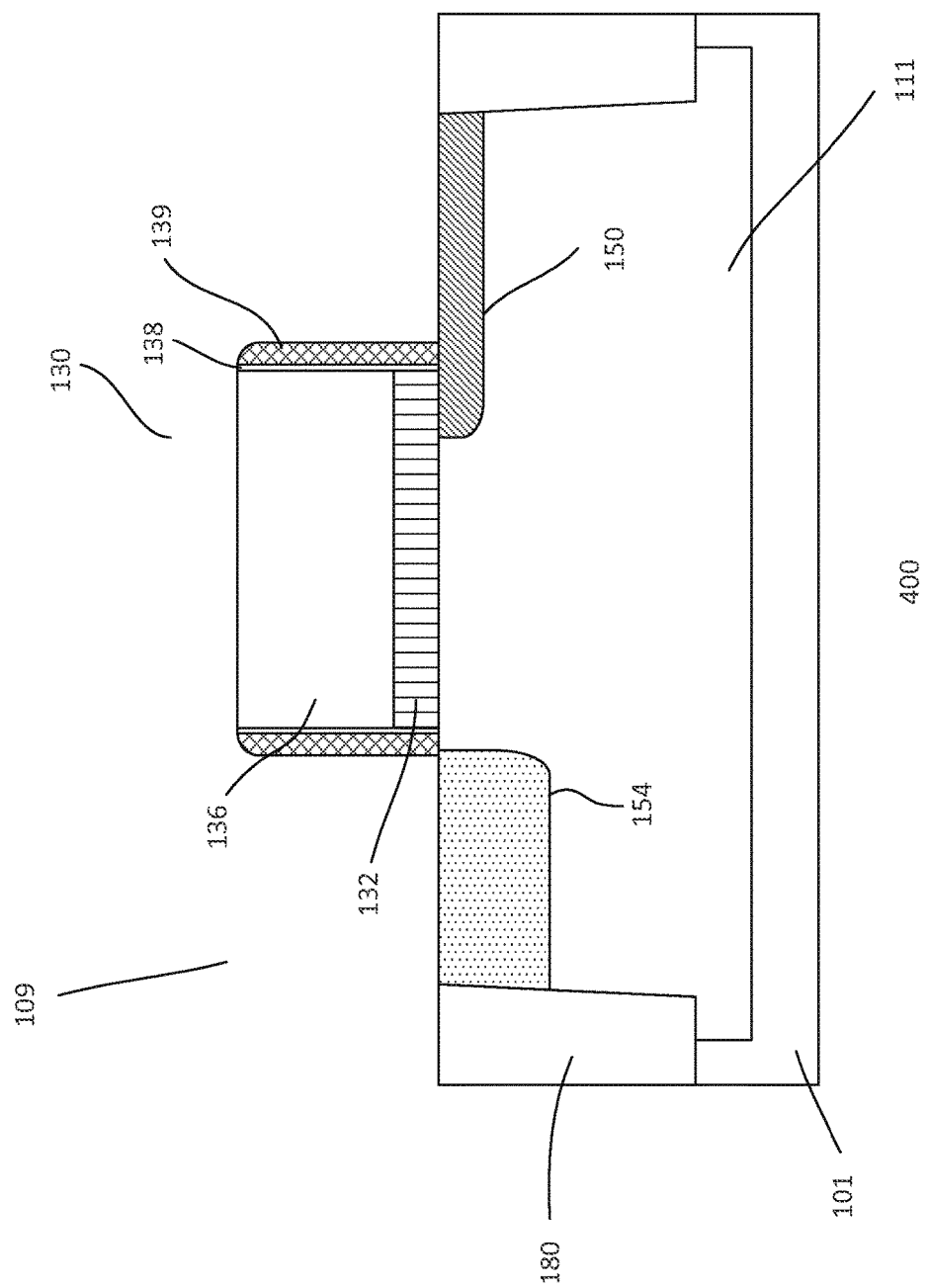

FIGS. 4a-4c show another embodiment of a process 400 for forming a device. The process is similar to that described in FIGS. 2a-2m and FIGS. 3a-3c. Common elements may not be described or described in detail. As shown in FIG. 4a, the device is at the stage of processing as described in FIG. 2e. For example, the process forms a transistor with a gate 130. A LD extension region 150 is disposed in the substrate adjacent to a first side of the gate.

Referring to FIG. 4b, dielectric liners 138 and dielectric spacers 139 are formed on sidewalls of the gate, as described in FIG. 2g. In FIG. 4c, the process continues to form a substrate base extension region 154. In one embodiment, the substrate base extension region is formed by ion implantation of second polarity type dopants. For example, the base extension region is formed using the same implant as that for S/D regions or LD extension regions of second polarity type transistors (not shown) of the device. This avoids the need for an additional implant mask specifically for the substrate base extension region. As shown, an edge of the substrate base extension region is aligned at about an outer edge of the dielectric spacer 139 formed on the second side of the gate. The process continues as described in FIG. 2h and onwards. In some cases, the process may include forming an elevated base extension region over the substrate base extension region, as described in FIGS. 3a-3c.

Figure 5A:
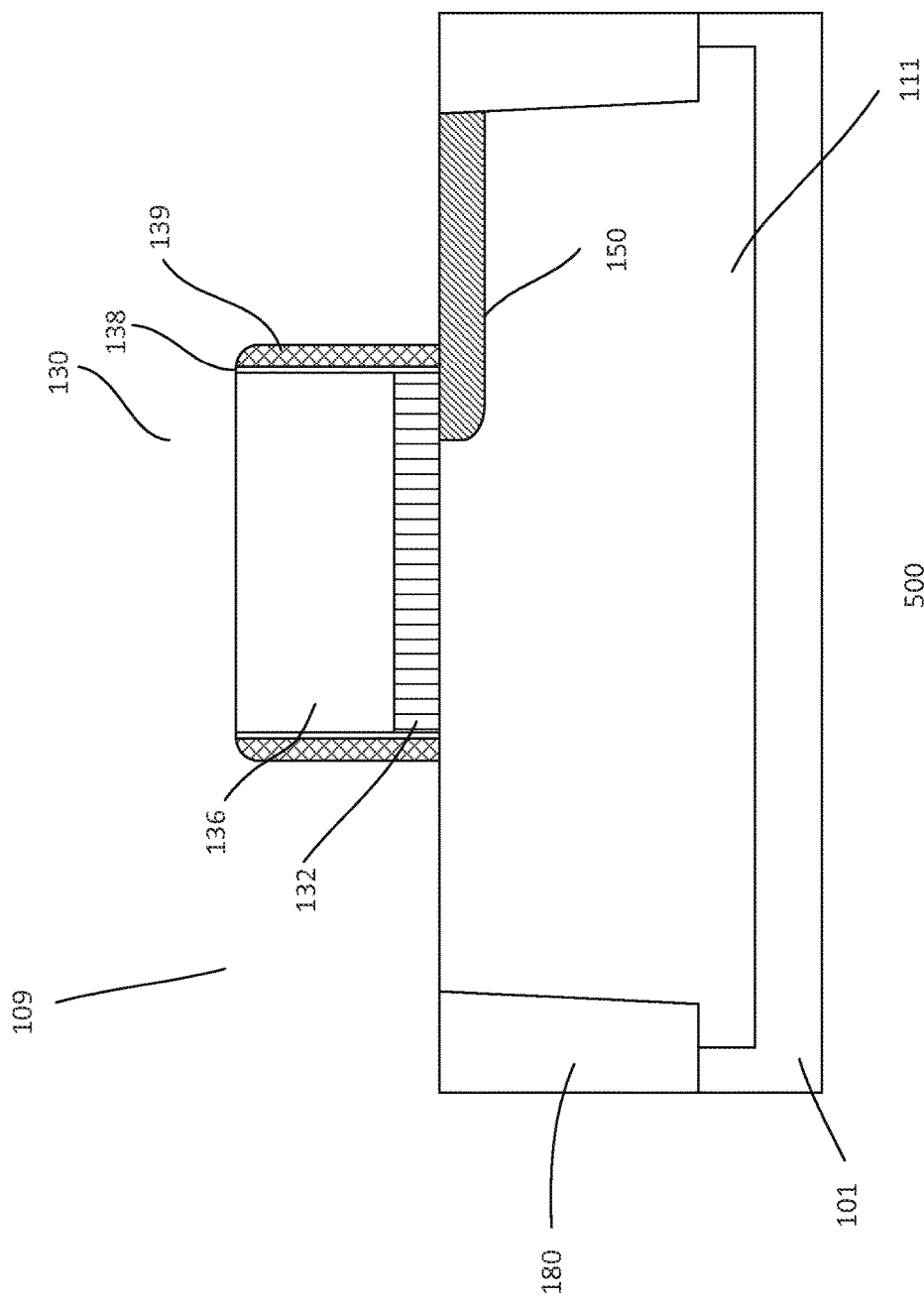
FIGS. 5a-5b show cross-sectional views of another embodiment of a process for forming a device.
Figure 5B:
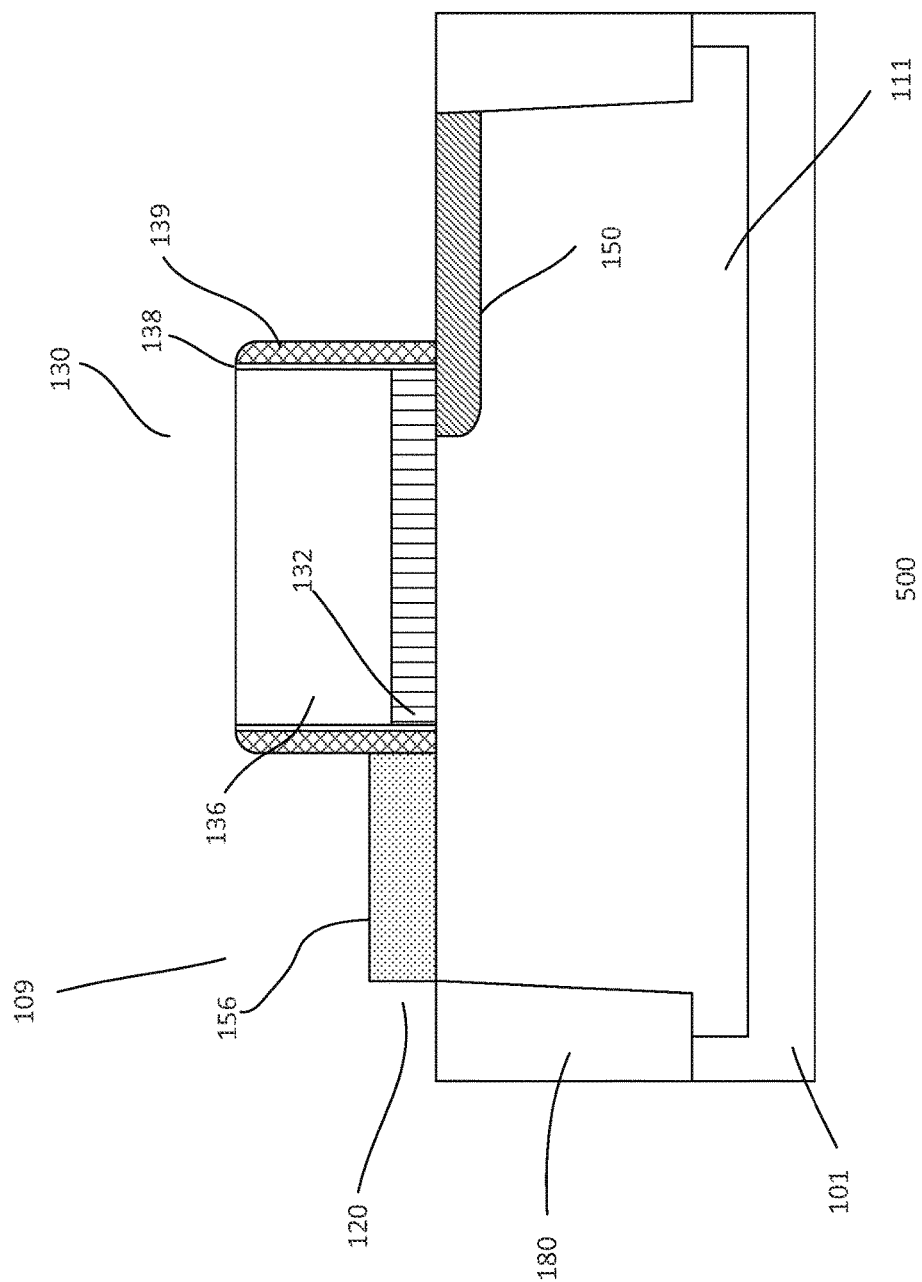

FIGS. 5a-5b show another embodiment of a process 500 for forming a device. The process is similar to that described iii FIGS. 2a-2m, FIGS. 3a-3c and FIGS. 4a-4c. Common elements may not be described or described in detail. As shown in FIG. 5a, the device is at the stage of processing as described in FIG. 4b. For example, the process forms a transistor with a gate 130 having dielectric spacers 139 disposed on its sidewall. A dielectric liner 138 is disposed between the gate sidewalk and spacers. A LD extension region 150 is disposed in the substrate adjacent to a first side of the gate.

Referring to FIG. 5b, the process continues to form an elevated base extension region 156. The elevated base extension region, for example, is formed by the process described in FIG. 3b. For example, a lower epi layer 120 is formed over the substrate adjacent to the second side of the gate. The epi layer is doped with second polarity type dopants by, for example, in-situ doping, ion implantation or both. The process continues as previously described from FIG. 2j and onwards.

Figure 6B:
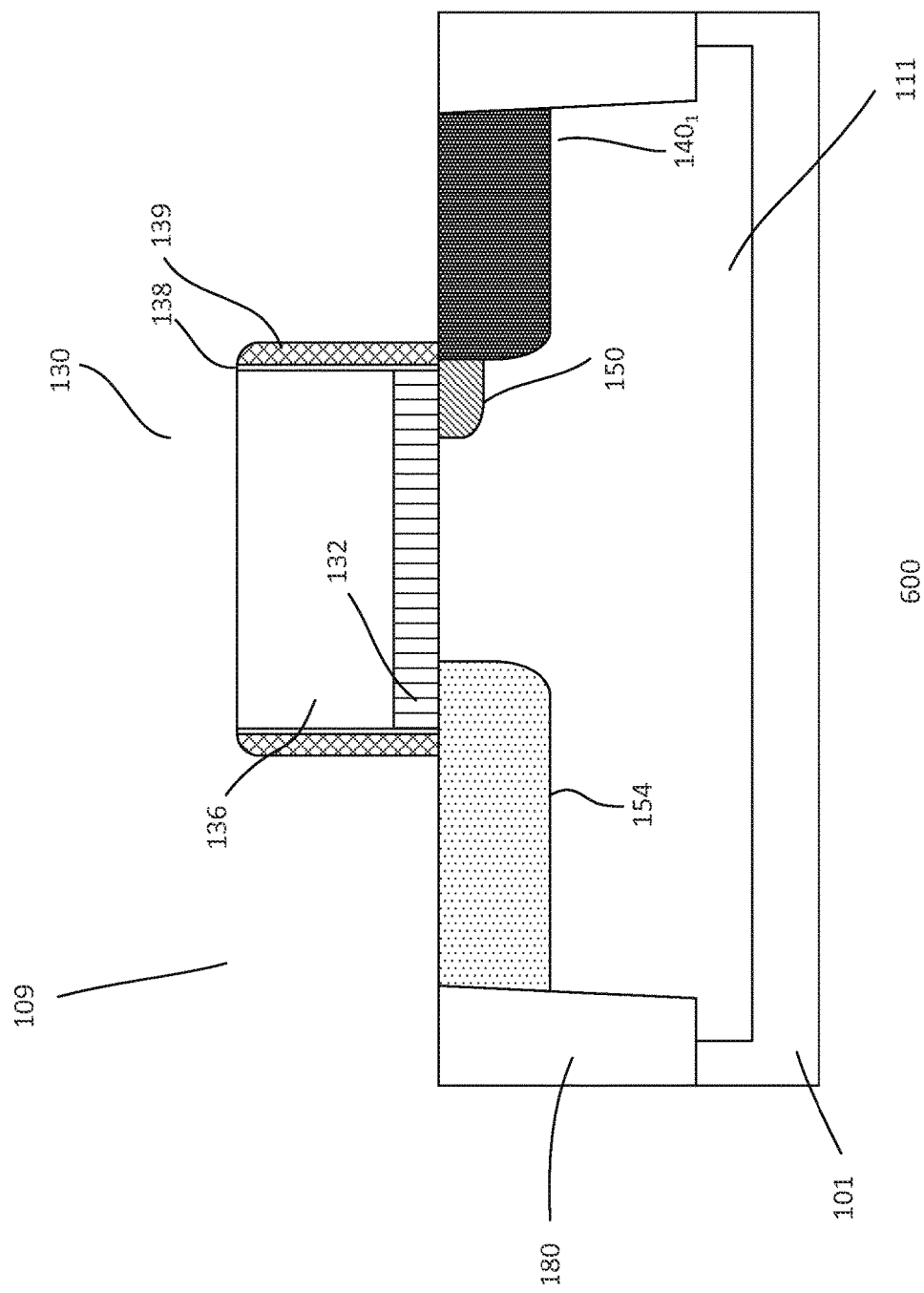

FIGS. 6a-6d show another embodiment of a process 600 for forming a device. The process is similar to that described in FIGS. 2a-2m, 3a-3c, 4a-4c, and 5a-5b. Common elements may not be described or described in detail. As shown in FIG. 6a, the device is at the stage of processing as described in FIG. 2g. For example, the process forms a transistor with a gate 130 having dielectric spacers disposed on its sidewalls. A dielectric liner 138 is disposed between the gate sidewalls and spacers. A LD extension region 150 is disposed in the substrate adjacent to a first side of the gate and a substrate base extension region 154 is disposed adjacent to a second side of the gate. The edge of the substrate base extension region may extend below the gate or aligned with about the edge of the dielectric spacer. For example, the substrate base extension region may be formed by using a second polarity type S/D or LD implant. Other configurations of the substrate base extension region may also be useful.

Referring to FIG. 6b, a first S/D region $140_1$ is formed. The first S/D region is formed, in one embodiment, by ion implantation of first polarity type dopants. For example, the first S/D region is formed in same process as forming first polarity type S/D regions or LD extension regions of transistors (not shown) of the device. The implant mask exposes the first S/D region while protecting the second S/D region of the device. It is understood that, in the case of using a second polarity type S/D implant to form the substrate base extension region, the first S/D region may be formed prior to the substrate base extension region.

In FIG. 6c, a S/D epi layer 122 is formed over the substrate base extension region adjacent to the second side of the gate. In one embodiment, the substrate adjacent to the first side of the gate is protected by a S/D epi mask while the substrate adjacent to the second side of the gate is exposed. The S/D epi layer is formed by, for example, SEG. Other techniques for forming the epi layer may also be useful.

Figure 6D:
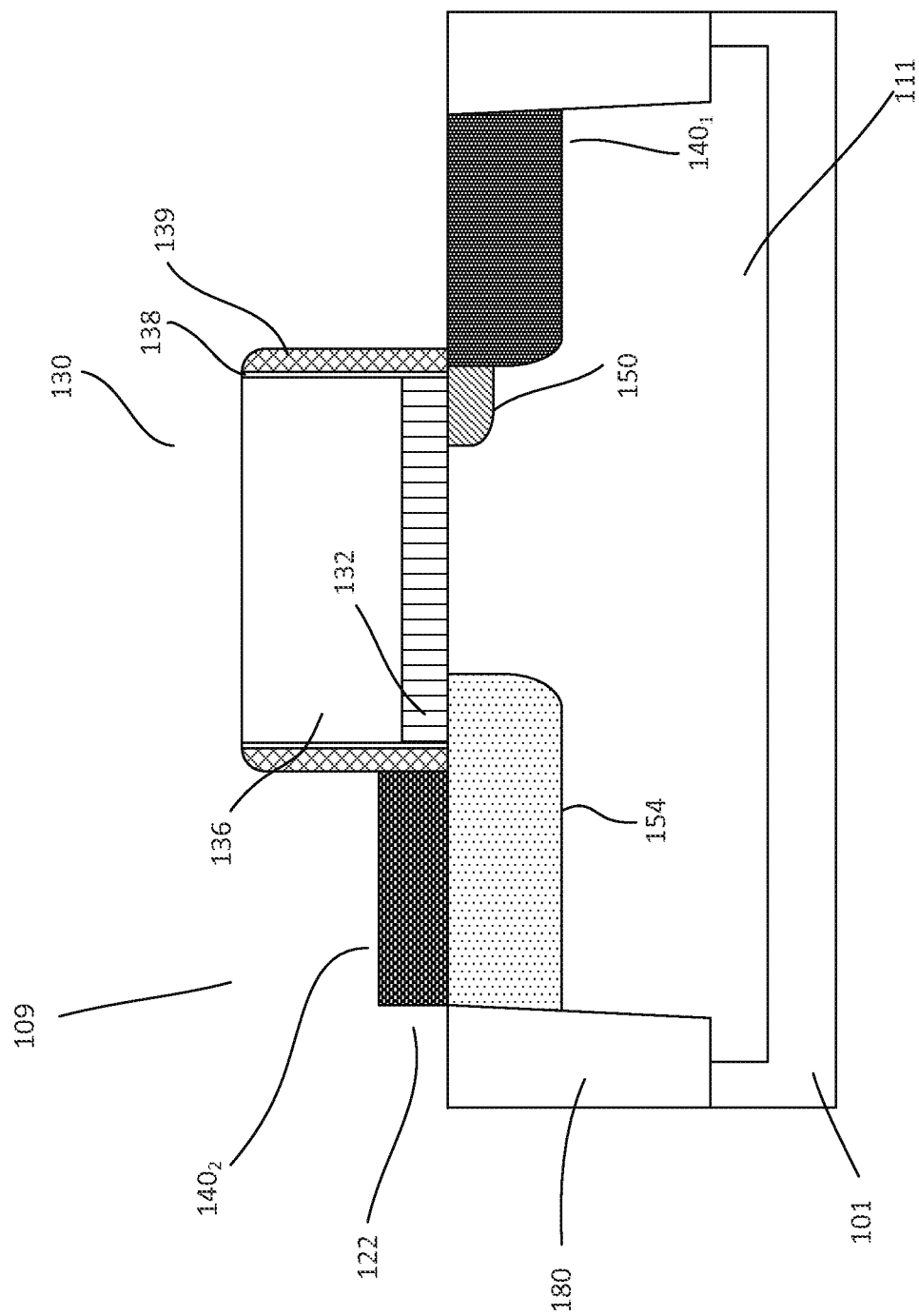

As shown in FIG. 6d, the S/D epi layer s doped, forming an elevated second S/D region $140_2$. The S/D epi layer is doped with first polarity type dopants. Doping the S/D epi layer may be achieved by, for example, in-situ doping, ion implantation or both. In some embodiments, a non-elevated first S/D region $140_1$ is formed by the same ion implantation which forms the second S/D region. The process continues as previously described from FIG. 2j and onwards.

As described in FIGS. 6a-6d, the first S/D region is formed in the substrate. For example, the first S/D region is a non-elevated S/D region. It is understood that various processes, such as that described in FIGS. 2a-2m, 3a-3c, 4a-4c and 5a-5b may be modified to provide a device with a non-elevated first S/D region.

Figure 7B:
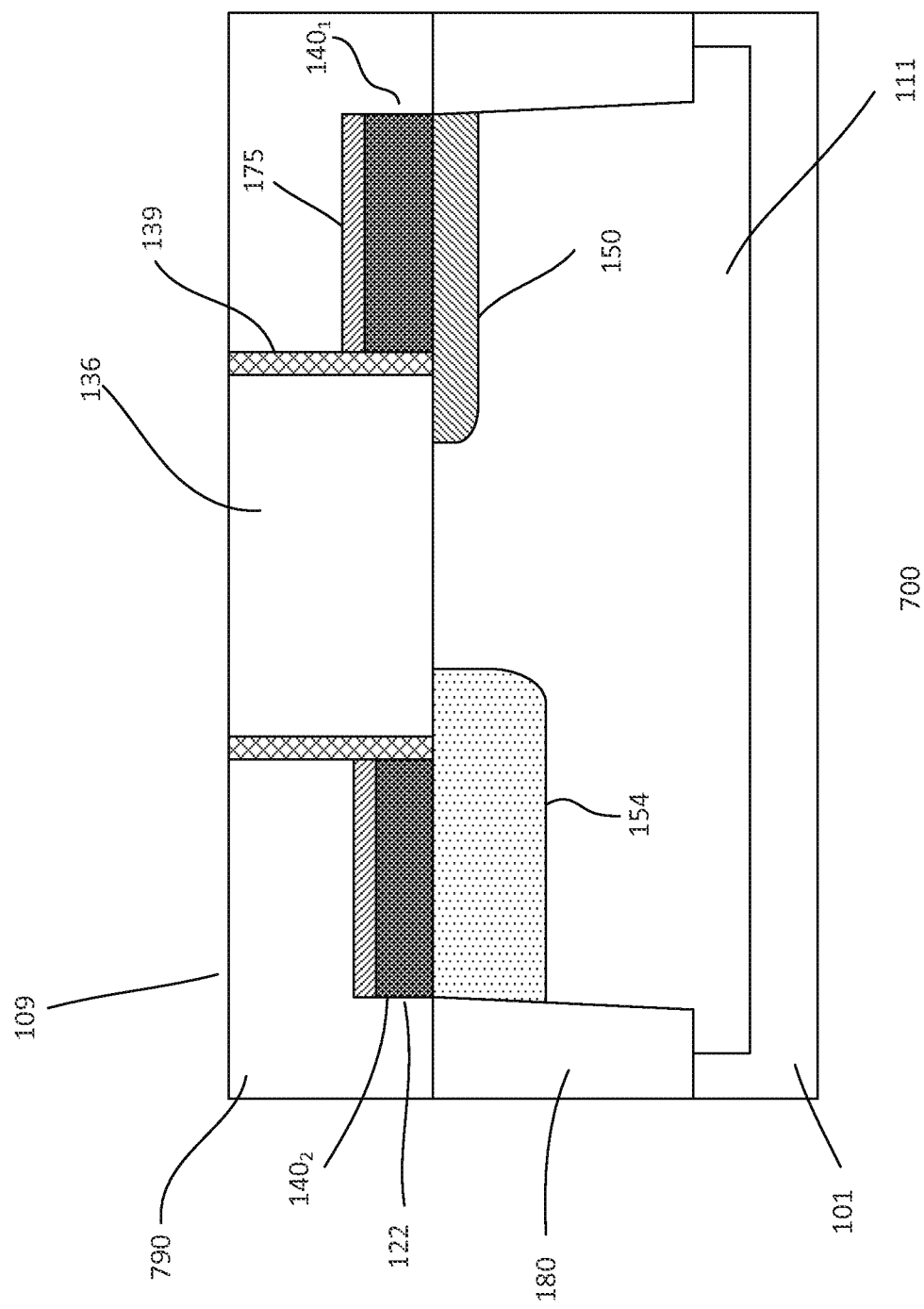

FIGS. 7a-7g show another embodiment of a process 700 for forming a device. The process is similar to that described in FIGS. 2a-2m, 3a-3c, 4a-4c, 5a-5b and 6a-6d. Common elements may not be described or described in detail. As shown in FIG. 7a, the device is at the stage of processing as described in FIG. 2k. For example, the process forms a transistor with a gate 730. The gate, in one embodiment, is a dummy gate having a dummy gate electrode 736 over a dummy gate dielectric 732. The gate serves as a sacrificial gate which is subsequently removed. Other types of dummy gates may also be useful. The dummy gate includes dielectric spacers 139 disposed on its sidewalls. A dielectric liner 138 may be disposed between the gate sidewalls and spacers.

A LD extension region 150 is disposed in the substrate adjacent to a first side of the gate and a substrate base extension region 154 is disposed adjacent to a second side of the gate. The edge of the base extension region, as shown, extends below the gate. Alternatively, the edge of the substrate base extension region may be aligned with about the edge of the dielectric spacer. For example, the substrate base extension region may be formed by using a second polarity type S/D or LD extension implant. Other configurations of the substrate base extension region may also be useful. In other embodiments, no substrate base extension region is provided.

Elevated S/D regions $140_1$-$140_2$ are disposed on the substrate in the device region adjacent to first and second sides of the gate. In some embodiments, the first S/D region may be a non-elevated S/D region. Metal silicide contacts are formed on the S/D regions and gate. Forming contacts at other stages of the process may also be useful. A dielectric layer 790 is formed over the substrate covering the transistor. The dielectric layer, for example, may be a silicon oxide layer. Other types of dielectric layers may also be useful.

Referring to FIG. 7b, the substrate is planarized. For example, the substrate is planarized by a CMP process. Other types of planarization processes may also be useful. The planarization process removes excess dielectric material as well as the metal silicide contact over the gate. The planarization process produces a planar top surface with the gate and dielectric layer.

Figure 7C:
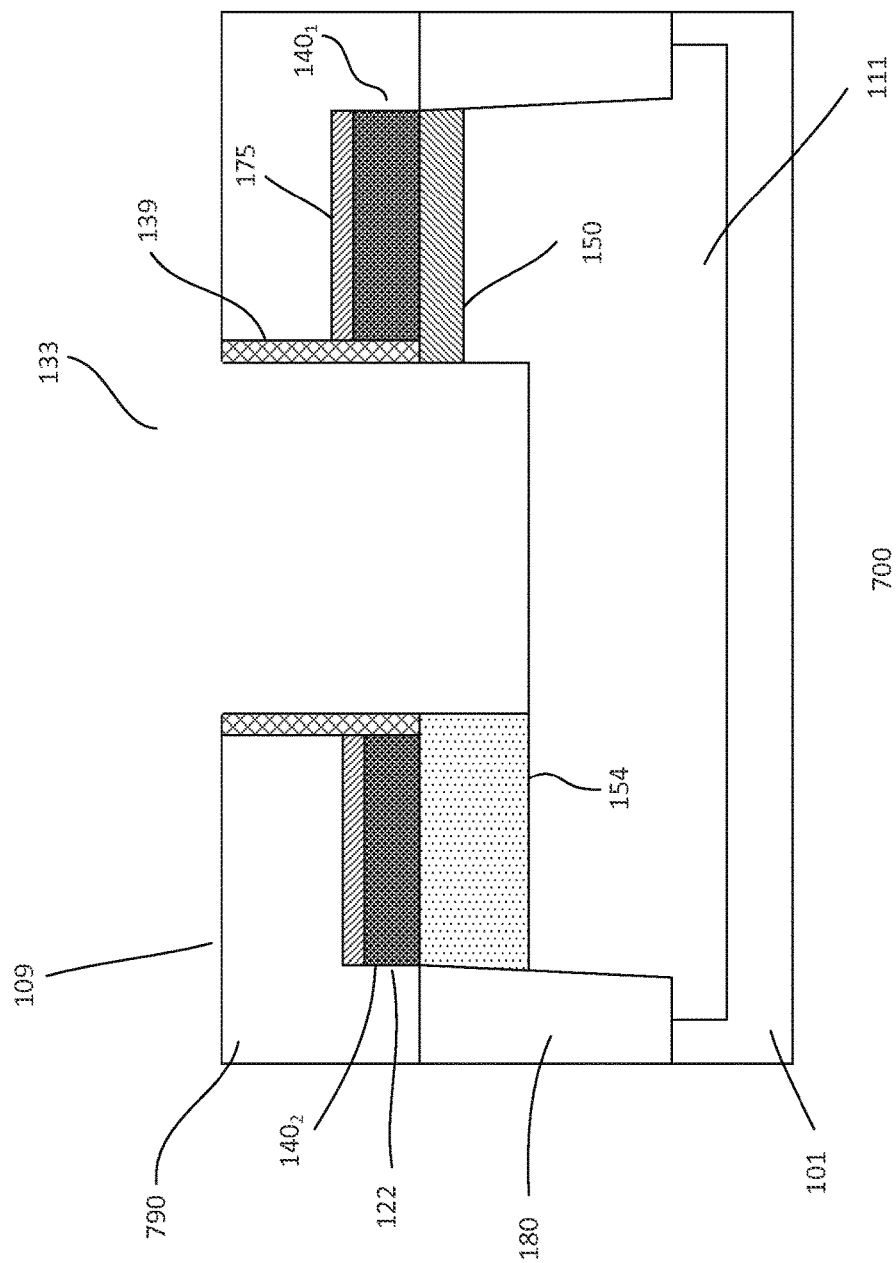

In FIG. 7c, the dummy gate is removed. Removing the dummy gate may be achieved using an anisotropic etch, such as a RIE process. Other types of etch processes or combination of etch processes may also be useful. In some embodiments, a combination of wet and dry etch processes may be used to remove the dummy gate. The etch selectively removes the dummy gate, forming a trench 133. In one embodiment, the etch also removes a portion of the substrate below the dummy gate, extending a depth of the trench below the surface of the substrate. In one embodiment, the trench extends to about the bottom of the substrate base extension region. Extending the trench to other depths below the substrate surface may also be useful. In other embodiments, the depth of the trench is about the top of the substrate. Providing other configurations of the trench may also be useful.

As shown in FIG. 7d, a gate dielectric layer 733 is formed. In one embodiment, the gate dielectric layer is a high-K dielectric layer. For example, the high-K dielectric layer serves as a gate dielectric for a metal gate. The high-K gate dielectric may be a Hf-based high-K dielectric, such as $HfO_2$, HfON, Hf—Si—$O_2$ or Hf—SiON, an Al-based high-K or a Zr-based high-K or a combination thereof. The gate dielectric layer is formed by, for example, CVD or sputtering. Other types of gate dielectric materials or forming techniques may also be useful. The gate dielectric layer, for example, lines the surface of the dielectric layer 790 and trench 133.

Figure 7E:
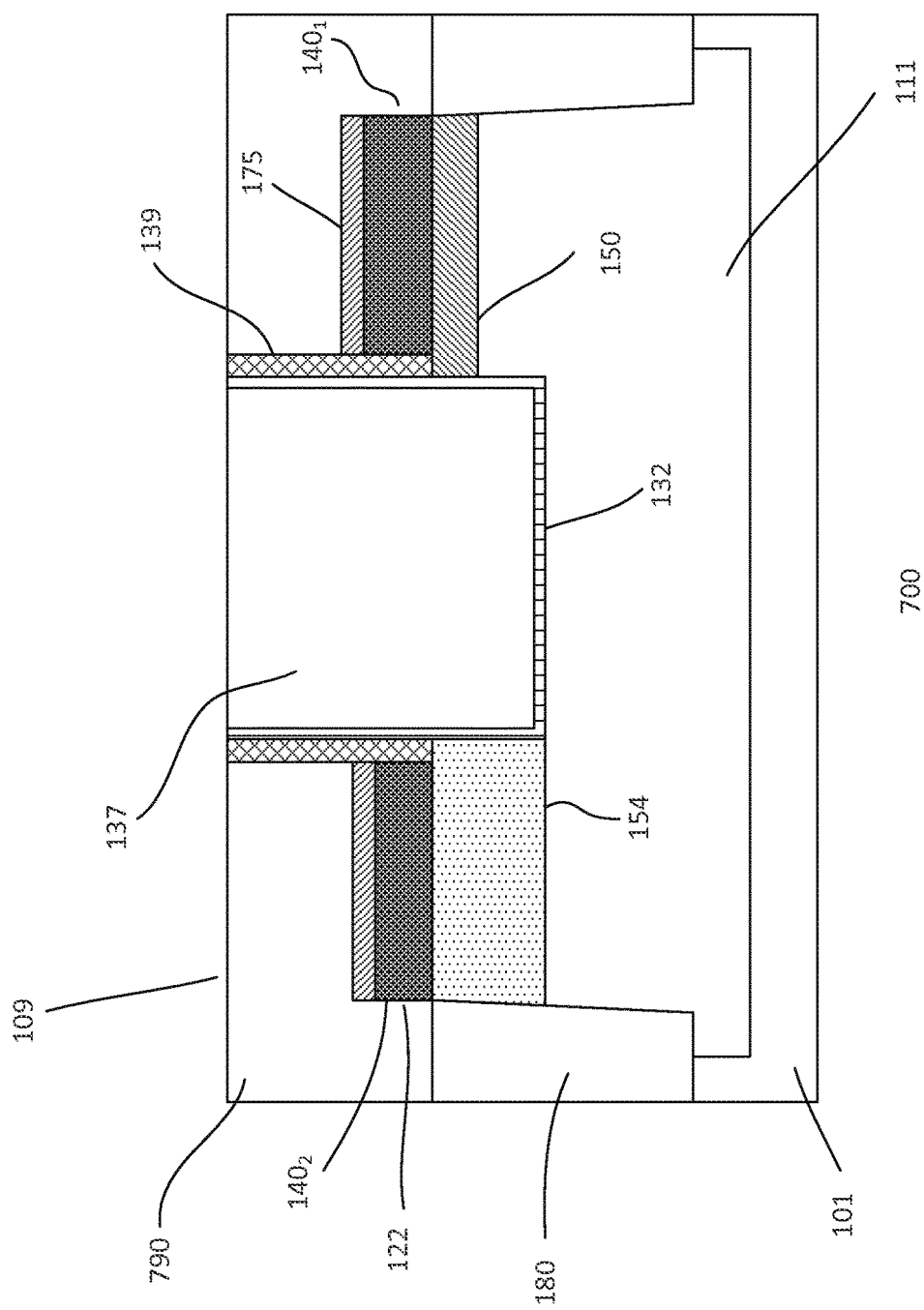

Referring to FIG. 7e, a metal gate electrode layer 137 is formed on the substrate. The metal gate layer fills the trench and covers the dielectric layer. The metal gate layer, for example, may be TiN, TaN, TiAlN, TaN/TiN, TaC, TaCN or a combination thereof. Other types of metal gate layers may also be useful. The metal gate layer, for example, may be formed by CVD or atomic layer deposition (ALD). Other forming techniques may also be useful. The substrate is planarized by, for example, CMP to remove excess gate electrode and gate dielectric material over the dielectric layer 790. The planarizing process produces a planar surface with the metal gate 137 and dielectric layer 790.

Figure 7F:
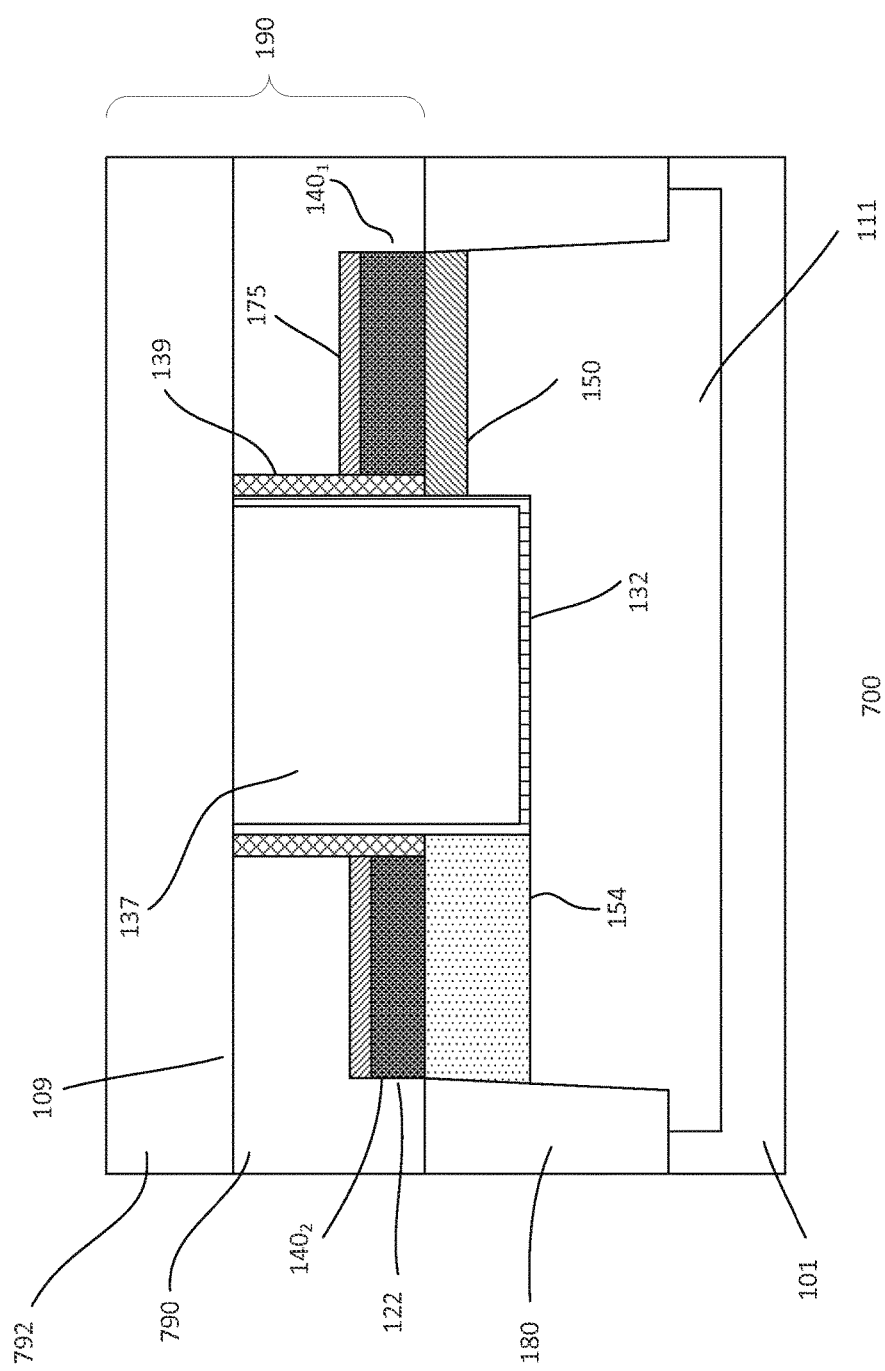

In FIG. 7f, an upper dielectric layer 792 is formed on the surface of the substrate. The upper dielectric layer covers the dielectric layer 790 and gate. The upper dielectric layer, for example, may be silicon oxide formed by CVD. Other types of dielectric layers or forming techniques may also be useful. The process continues as described in FIG. 2l and onwards. The metal gate process as described in FIGS. 7a-7f may be applied to the various embodiments of GGMOS described in, for example, FIGS. 1a-1g as well as the processes of FIGS. 2a-2m, 3a-3c, 4a-4c, 5a-5b and 6a-6d.

As described, the processes form a GGMOS with an extended base. The processes described may be used to form a GGMOS with a substrate extended base, an elevated extended base or a combination thereof. In other embodiments, the extended base may be formed when forming S/D or LD extension regions of second polarity type devices (not shown). Other configurations of forming the extended base may also be useful. For an elevated base, it may be a self-aligned extended base formed by in-situ doping during epi growth. The processes may be used to form an elevated second S/D region over the substrate base extension region or elevated base extension region. The processes may also be used to form a non-elevated first S/D region or an elevated first S/D region.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
   providing a substrate with a device region;
   forming a gate on the substrate in the device region;
   forming a base extension region having second polarity type dopants adjacent to a second side of the gate;
   forming first and second source/drain (S/D) regions, wherein the first and second S/D regions comprise first polarity type dopants, the first and second S/D regions are disposed adjacent to first and second sides of the gate respectively, wherein forming the second S/D region comprises forming an elevated second S/D region on the substrate and disposed over the base extension region; and
   forming interconnections between the second S/D region and gate with ground to form a gate-grounded metal oxide semiconductor (GGMOS) device.

2. The method of claim 1 wherein forming the elevated second S/D region comprises:
   forming a second S/D epitaxial layer on the device region adjacent to the second side of the gate over the base extension region; and
   doping the second S/D epitaxial layer with first polarity type dopants.

3. A method of forming a device comprising:
   providing a substrate with a device region;
   forming a gate on the substrate in the device region;
   forming an elevated base extension region having second polarity type dopants adjacent to a second side of the gate, wherein forming the elevated base extension region comprises
      forming a base extension epitaxial layer on the device region adjacent to the second side of the gate, and
      doping the base extension epitaxial layer with second polarity type dopants;
   forming first and second source/drain (S/D) regions, wherein the first and second S/D regions comprise first polarity type dopants, the first and second S/D regions are disposed adjacent to first and second sides of the gate respectively, wherein forming the second S/D region comprises forming an elevated second S/D region on the substrate and disposed over the elevated base extension region; and
   forming interconnections between the second S/D region and gate with ground to form a gate-grounded metal oxide semiconductor (GGMOS) device.

4. The method claim 3 wherein doping the base extension S/D epitaxial layer comprises ion implantation.

5. The method of claim 1 wherein forming the base extension region forms a non-elevated base extension region comprising:
   implanting second polarity type dopants into the substrate adjacent to the second side of the gate to form a non-elevated base extension region; and
   forming the elevated second S/D region over the non-elevated base extension region.

6. The method of claim 5 wherein the non-elevated base extension region extends under the second side of the gate.

7. The method of claim 1 wherein forming the base extension region comprises:
   forming a non-elevated base extension region by implanting second polarity type dopants into the substrate adjacent to the second side of the gate;
   forming an elevated base extension region on the substrate over the non-elevated base extension region by forming and doping a base extension epitaxial layer on the substrate over the non-elevated base extension region; and
   forming the elevated second S/D region over the elevated base extension region.

8. The method of claim 1 comprises forming a lightly doped (LD) extension region in the substrate adjacent to the first side of the gate, wherein the LD extension region comprises first polarity type dopants.

9. The method of claim 8 wherein forming the first S/D region forms an elevated first S/D region on the substrate comprising forming and doping a first S/D epitaxial layer on the substrate in the device region adjacent to the first side of the gate over the LD extension region.

10. The method of claim 8 wherein forming the first S/D region forms a non-elevated first S/D region comprising implanting first polarity type dopants in the substrate adjacent to the first side of the gate.

11. The method of claim 1 wherein forming the gate forms a metal gate comprising:
    forming a dummy gate; and
    forming an interlevel dielectric (ILD) layer on the substrate covering the dummy gate and first and second S/D regions;
    planarizing the ILD layer to form a coplanar surface with the dummy gate and ILD layer;
    removing the dummy gate to form a gate trench; and
    forming the metal gate in the gate trench.

12. The method of claim 11 wherein the gate trench extends below a surface of the substrate.

13. The method of claim 1 wherein the first polarity type dopants comprise n-type and the second polarity type dopants comprise p-type to form a n-type GGMOS (GGNMOS) device, wherein the GGNMOS serves as an ESD protection device.

14. A GGMOS device comprising:
    a substrate with a device region;
    a gate having first and second sides disposed on the substrate;
    a base extension region comprising second polarity type dopants disposed adjacent to the second side of the gate;
    a first S/D region disposed adjacent to the first side of the gate; and
    an elevated second S/D region on the substrate and disposed adjacent to the second side of the gate over the base extension region, where the first and second S/D regions comprise first polarity type dopants; and
    an interconnection connecting the second S/D region and the gate to ground.

15. The GGMOS device of claim 14 wherein the first polarity type dopants comprises n-type to form a GGNMOS.

16. The GGMOS device of claim 14 wherein the base extension region comprises:
    a non-elevated base extension region in the substrate adjacent to the second side of the gate;

an elevated base extension region on the substrate adjacent to the second side of the gate over the non-elevated base extension region; and the elevated second S/D region disposed over the elevated base extension region adjacent to the second side of the gate.

17. The GGMOS device of claim 14 wherein:

the first S/D region comprises an elevated first S/D region adjacent to the first side of the gate; and further comprises a LD extension region in the substrate adjacent to the first side of the gate below the first S/D region.

18. The GGMOS device of claim 14 wherein the gate comprises a metal gate.

19. A method of forming a GGMOS device comprising:

providing a substrate with a device region;

forming a gate on the substrate in the device region, the gate having first and second sides;

forming a base extension region having second polarity type dopants adjacent to the second side of the gate;

forming first and second S/D regions adjacent to the first and second sides of the gate respectively, wherein the first and second S/D regions comprise first polarity type dopants, wherein forming the second S/D region comprises forming an elevated second S/D region on the substrate which includes forming a second S/D epitaxial layer in the device region adjacent to the second side of the gate over the base extension region; and forming interconnections between the second S/D region and the gate with ground.

20. The method of claim 19 wherein forming the base extension region comprises:

forming a non-elevated base extension region by implanting second polarity type dopants into the substrate adjacent to the second side of the gate;

forming an elevated base extension region on the substrate over the non-elevated base extension region by forming and doping a base extension epitaxial layer on the substrate over the non-elevated base extension region; and forming the elevated second S/D region over the non-elevated base extension region.

* * * * *